(12) United States Patent
Yamada et al.

(10) Patent No.: US 8,283,783 B2
(45) Date of Patent: Oct. 9, 2012

(54) SOLDER MATERIAL, METHOD FOR MANUFACTURING THE SAME, JOINED BODY, METHOD FOR MANUFACTURING THE SAME, POWER SEMICONDUCTOR MODULE, AND METHOD FOR MANUFACTURING THE SAME

(75) Inventors: Yasushi Yamada, Nishikamo-gun (JP); Yuji Yagi, Nissin (JP); Yoshikazu Takaku, Sendai (JP); Ikuo Ohnuma, Shibata-gun (JP); Kiyohito Ishida, Sendai (JP); Takashi Atsumi, Okazaki (JP); Ikuo Nakagawa, Kariya (JP); Mikio Shirai, Toyota (JP)

(73) Assignees: Toyota Jidosha Kabushiki Kaisha, Toyota-shi (JP); Tohoku University, Sendai-shi (JP)

( * ) Notice: Subject to any disclaimer, the term of this patent is extended or adjusted under 35 U.S.C. 154(b) by 303 days.

(21) Appl. No.: 12/669,346

(22) PCT Filed: Nov. 19, 2008

(86) PCT No.: PCT/JP2008/071043
§ 371 (c)(1),
(2), (4) Date: Jan. 15, 2010

(87) PCT Pub. No.: WO2009/066704
PCT Pub. Date: May 28, 2009

(65) Prior Publication Data
US 2010/0193801 A1      Aug. 5, 2010

(30) Foreign Application Priority Data

Nov. 20, 2007   (JP) ................. 2007-300792

(51) Int. Cl.
*H01L 23/48* (2006.01)
*H01L 21/00* (2006.01)
(52) U.S. Cl. ........................................ 257/772; 438/119
(58) Field of Classification Search .................. 257/772; 438/119
See application file for complete search history.

(56) References Cited

U.S. PATENT DOCUMENTS 6,186,390 B1    2/2001   Tadauchi et al.
(Continued)

FOREIGN PATENT DOCUMENTS

CN    87106949 A    7/1988
(Continued)

OTHER PUBLICATIONS

Youichiro Baba, "Activity for Quality of Hybrid-Vehicle Inverter", Summaries of Lectures in National Convention by Japan Welding Society, Sep. 2005, p. F-16, Lines 11-24, No. 77.

(Continued)

*Primary Examiner* — Lex Malsawma
(74) *Attorney, Agent, or Firm* — Sughrue Mion, PLLC

(57) ABSTRACT

A zinc based solder material 55 of the present invention is prepared by providing on the surface of a zinc based material 50, from which an oxide film 501 has been removed or at which an oxide film 501 does not exist, with a coating layer 51 containing primarily a metal whose oxide is more easily reducible than the oxide film 501. In a joined body and a power semiconductor module of the present invention, the zinc based solder material 55 is used in the joining portion, and after joining, the coating layer 51 does not exist.

27 Claims, 8 Drawing Sheets

U.S. PATENT DOCUMENTS

| | | |
|---|---|---|
| 6,386,426 B1 | 5/2002 | Tadauchi et al. |
| 2003/0059642 A1* | 3/2003 | Mei .................. 428/570 |
| 2004/0089945 A1* | 5/2004 | Omori et al. .................. 257/736 |
| 2004/0124526 A1* | 7/2004 | Matayabas et al. ........... 257/712 |
| 2006/0125105 A1* | 6/2006 | Kitajima et al. .............. 257/772 |

FOREIGN PATENT DOCUMENTS

| | | |
|---|---|---|
| CN | 1753177 A | 3/2006 |
| JP | 63-293952 A | 11/1988 |
| JP | 08-164496 A | 6/1996 |
| JP | 11-172352 A | 6/1999 |
| JP | 11-172353 A | 6/1999 |
| JP | 11-172354 A | 6/1999 |
| JP | 11-192583 A | 7/1999 |
| JP | 11-208487 A | 8/1999 |
| JP | 11-288955 A | 10/1999 |
| JP | 2000-061686 A | 2/2000 |
| JP | 2000-208533 A | 7/2000 |
| JP | 2002-120086 A | 4/2002 |
| JP | 2004-358539 A | 12/2004 |
| JP | 2004-358540 A | 12/2004 |
| JP | 2005-167257 A | 6/2005 |
| JP | 2006-167748 A | 6/2006 |
| JP | 2006-320912 A | 11/2006 |
| JP | 2007-281412 A | 10/2007 |
| WO | 2006/098454 A1 | 9/2006 |

OTHER PUBLICATIONS

Chinese Office Action issued Jul. 27, 2011 for counterpart Chinese application 200880022649.6.

* cited by examiner (A)

(B)

(C)

SOLDER MATERIAL, METHOD FOR MANUFACTURING THE SAME, JOINED BODY, METHOD FOR MANUFACTURING THE SAME, POWER SEMICONDUCTOR MODULE, AND METHOD FOR MANUFACTURING THE SAME

TECHNICAL FIELD

The present invention relates to a solder material and a method for manufacturing the same, a joined body and a method for manufacturing the same, and a power semiconductor module and a method for manufacturing the same. The invention relates in particular to a lead-free solder material, a joined body and a power semiconductor module using a lead-free solder material, and a method for manufacturing them.

BACKGROUND ART

Up to now, lead (Pb) based solder materials have been used widely as solder materials. Particularly, Pb—Sn solder materials have been used in which their melting point is changed in the range of from about 183 to about 300° C. by changing the ratio of lead (Pb) to tin (Sn) therein, whereby solder materials having a suitable soldering temperature have been obtained (see for example, Non-Patent Document 1).

However, lead is poisonous and is thus there is a trend towards the abolition of its use, and there have been demands for development of lead-free solder materials.

Among demands for such solder materials, tin (Sn) based solder materials having various compositions, such as an Sn—Ag alloy and an Sn—Cu alloy, have been proposed.

However, tin based solder materials have a melting point of about 220° C., and thus melt at about 220° C., and the tensile strength thereof is reduced significantly around 200° C.

Examples of bodies to be joined with solder materials include power semiconductor modules.

A power semiconductor module is constructed usually by providing a power semiconductor with an insulator so as to insulate the power semiconductor electrically from a current-carrying part. The power semiconductor and the insulator are joined together via a solder or the like.

The power semiconductor module is provided with a radiator plate to efficiently diffuse or temporarily disperse generated heat from a semiconductor element, and the radiator plate and the insulator are joined together via a solder or the like.

Accordingly, the power semiconductor module has been joined generally at two portions; that is, at a portion between the semiconductor element and the insulator and at a portion between the insulator and the radiator plate.

Up until now, the Pb—Sn solder materials containing lead and tin in varying ratios have been used in these two joining portions of the power semiconductor module.

Next-generation power semiconductor elements GaN and SiC have heat resistance at 200° C. or more, a high dielectric breakdown electric field and saturation electron density etc. and can thus deal with a large current at a high operating voltage. Due to the magnitude of this current, the semiconductor element generates heat to a temperature of about 200° C., and so soldered joining portions are also required to be heat-resistant at 200° C. or more.

Harmless solder materials with a melting point of higher than 250° C. are found occasionally only at the research stage, and only a few come into practical use. There are examples where an Au—Sn alloy (having a melting point of 280° C.) has been used for specific applications, but this alloy is a material containing 80% Au and is thus very expensive and difficult to apply to consumer devices.

As one type of harmless joining material having a melting point higher than 250° C., an Ag based brazing material is generally known, but this material has a high melting point of 600° C. or more such that, when it is used in joining by melting at such a temperature, it damages and denatures semiconductor elements, thus making it unusable for the present purpose. In consideration of the process of manufacturing semiconductor modules, the maximum heating temperature usable in joining is about 450° C.

Under these circumstances, zinc based materials have been examined as solder materials having high melting points. For example, solder materials including Ge and Mg added to Zn—Al alloys (see, for example, Patent Document 1), solder materials including Mg and Sn added to Zn—Al alloys (see, for example, Patent Document 2), solder materials including Mg and In added to Zn—Al alloys (see, for example, Patent Document 3), solder materials including Ge, Sn and In added to Zn—Al alloys (see, for example, Patent Document 4), solder materials including Ge and Mg added to Zn—Al alloys (see, for example, Patent Documents 5 to 7), solder materials including Ge and P added to Zn—Al alloys (see, for example, Patent Document 8), and solder materials including Ge, Mg and P added to Zn—Al alloys (see, for example, Patent Document 9) have each been disclosed.

Patent Document 1: Japanese Patent Application Laid-Open (JP-A) No. 11-288955
Patent Document 2: JP-A No. 11-208487
Patent Document 3: JP-A No. 11-172354
Patent Document 4: JP-A No. 11-172353
Patent Document 5: JP-A No. 11-172352
Patent Document 6: JP-A No. 2000-208533
Patent Document 7: JP-A No. 2000-61686
Patent Document 8: JP-A No. 2004-358540
Patent Document 9: JP-A No. 2004-358539
Non-Patent Document 1: Yoichiro Baba "Dealing with HV Inverter Quality Maintenance", Japan Welding Society, National Meeting, Lecture Summary, Chapter 77 (2005-9), Japan Welding Socity

DISCLOSURE OF INVENTION

Problems to be Solved by the Present Invention

A first object of the present invention is to provide a solder material containing primarily zinc and being capable of dense joining.

A second object of the present invention is to provide a joined body and a power semiconductor module, which have high heat-resistant and are joined densely.

A third object of the present invention is to provide methods for manufacturing each of a solder material, a joined body and a power semiconductor module, which are capable of dense joining, respectively.

Means for Solving Problems

A solder material containing primarily zinc has a high melting point and is excellent in heat resistance, but has a property of being liable to natural oxidation in which an oxide film forms on the surface thereof which is difficult to reduce. As a result, even if the solder material containing primarily zinc is heated in a reducing atmosphere to a temperature in the vicinity of its melting point, it is difficult to remove all of an oxide film from the surface thereof.

In conventional methods, therefore, an external physical force such as scrubbing is applied to the solder during melting in a soldering process, in order to remove the oxide film on the surface. Due to the external physical force, the oxide film on the surface is broken so that a molten solder material inside of the film flows out and contacts with a surface to be joined, thereby joining the surface with the solder material.

In this method, however, it has been revealed that the broken oxide film remains in the vicinity of the surface of the solder material, thus suppressing dense joining. A joined body that has not been densely joined has increased heat resistance and electric resistance at a joining portion thereof. Particularly, when a power semiconductor module is manufactured as the joined body, the density of generated heat and amount of current increases at a joining portion thereof, thus exerting a significant influence on heat resistance and electric resistance.

Further, even if an oxide film on the surface of a solder material is to be chemically removed with use of a chemical solution, the chemical solution penetrates into the solder material via a minute opening, for example, at the edge of the solder material, and the solder material is dissolved before the oxide film is dissolved. As a result, the original object of removing the oxide film is difficult to achieve.

As another method of removing an oxide film on the surface of a solder material, mechanical polishing is also conceivable, but the surface of the solder material containing primarily zinc is easily oxidized, thus rapidly forming an oxide film again upon mechanical polishing in air. In addition, a method of mechanical polishing in a reducing atmosphere requires a polishing apparatus to be placed entirely in a reducing atmosphere and is thus difficult for reasons of safety or obtaining appropriate facilities.

Particularly for a power semiconductor module, it is preferable from the viewpoint of uniform joining that the solder material is a foil shape that matches the surface of a body to be joined. Accordingly, the surface area of the solder material increases relative to the volume thereof, and so there is a problem that the proportion of natural oxide film on the solder material is also readily increased.

In light of the foregoing problems, the inventors made extensive studies and found that the following invention is effective in solving the above problems.

The present invention in a first aspect is directed to a solder material containing primarily zinc, in which a surface of a material containing primarily zinc, from which an oxide film has been removed, or at which an oxide film does not exist, is provided with a coating layer containing primarily a metal whose oxide is more easily reducible than the oxide film.

The present invention described in the first aspect is directed to a solder material containing primarily zinc (also referred to hereinafter as "Zn based solder material"), a surface of a material containing primarily zinc from which an oxide film has been removed, or at which an oxide film does not exist, and then the surface is provided with a coating layer containing primarily a metal whose oxide is more easily reducible than the oxide film (also referred to hereinafter as "easily reducible metal"), so as to prevent an oxide film from forming again. In the present invention, the Zn based solder material provided with a coating layer after removal of an oxide film from the surface of the material is used, thereby allowing an undesirable joining state caused by an oxide film remaining on the joined surface to be avoided, and thus achieving dense joining.

The reason for use of the "material containing primarily a metal whose oxide is more easily reducible than the oxide film" as the coating layer to prevent an oxide film from forming again is that, even if a natural oxide film is formed on the surface of the coating layer, the natural oxide film can be easily removed by reduction. That is, natural oxide film of the easily reducible metal can be reduced by heating for melting upon soldering. As a result, the surface to be joined can be densely joined with the solder material without a natural oxide film inhibiting the joining.

The phrase "an oxide film does not exist at a surface thereof" refers to a state in which no oxide film was originally formed on the surface, thus making it unnecessary to remove an oxide film on the surface of the material containing primarily zinc. Specifically, when the material containing primarily zinc is cut in a reducing atmosphere or the like, an oxide film is not formed on the surface thereof.

The present invention described in a second aspect is directed to the solder material containing primarily zinc according to the first aspect, in which the coating layer is a layer containing primarily copper.

The reasons that a material containing primarily copper is preferable for preventing an oxide film from forming again are as follows:

(1) A natural oxide film formed on the surface of copper can be easily removed by reduction or the like.

(2) Copper on the surface of the solder material melts in the molten zinc based solder during joining, and the copper layer is eliminated after joining. Accordingly, even when copper is arranged on the surface of the solder material, it does not have a significant influence on the durability of the joined body after joining.

The present invention described in a third aspect is directed to the solder material containing primarily zinc according to the first or second aspect, in which the material containing primarily zinc is a pure zinc or an alloy represented by $Zn_{(1-x-y)}Al_xM_y$, in which x is from 0.02 to 0.10, y is from 0 to 0.02, and M represents a metal other than zinc and aluminum.

The Zn based solder material has properties such as high thermal conductivity, high electric conductivity and high softness, and thus is advantageous because of easy formability into a foil solder. In addition, the Zn based solder material has a melting point of about 330 to 420° C., is excellent in heat resistance and is excellent in handleability.

In further consideration of handleability upon soldering, there are cases where it is desirable for the melting point of the solder material to be lower than that of pure zinc (which has a melting point of 420° C.). The alloy represented by $Zn_{(1-x-y)}Al_xM_y$, which includes aluminum added to zinc, has a melting point (solidus temperature) of approximately 380° C. and is thus practical for this purpose.

The present invention described in a fourth aspect is directed to the solder material containing primarily zinc according to any one of the first to third aspects, in which the thickness of the coating layer is from 5 nm to 500 nm.

In the present invention, the coating layer on the surface of the solder material preferably does not exist the joined surface after joining, from the viewpoint of preventing an unexpected influence of the coating layer after joining. To realize this, the thickness of the coating layer before joining is preferably 500 nm or less. On the other hand, the thickness of the coating layer is preferably 5 nm or more, in order to prevent an oxide film from forming on the surface of the Zn based solder material.

The present invention described in a fifth aspect is directed to a joined body containing a first member and a second member, in which:

the first member and the second member are joined together with the solder material containing primarily zinc having a coating layer on the surface according to any one of the first to fourth aspects, and the coating layer does not exist at a joined surface after joining with the solder material containing primarily zinc.

The present invention described in the fifth aspect is directed to a joined body which has been joined with the Zn based solder material of any one of the first to fourth aspects.

The joined body using the Zn based solder material of the present invention may be densely joined because it is not prevented from joining by an oxide film. Accordingly, the joined body can prevent heat resistance and electric resistance from increasing at the joining portion thereof.

The present invention described in a sixth aspect is directed to the joined body according to the fifth aspect, in which the surfaces to be joined of the first member and the second member are each provided with a nickel layer.

In the present invention described in the sixth aspect, the Zn based solder material is contacted with a nickel layer. Zinc (Zn) and nickel (Ni), even when contacted with each other at high temperatures, rarely form unnecessary reaction products. Accordingly, these metals, even upon exposure to a thermal cycling, are difficult to form unnecessary reaction products at the joining interface.

According to the present invention described in the sixth aspect, it is therefore not only possible to form a dense joining, but also possible to prevent formation of unnecessary reaction products. As a result, cracking attributable to reaction products can be prevented, and deficiencies such as peeling at the interface can also be prevented.

The present invention described in a seventh aspect is directed to the joined body according to the sixth aspect, in which the a surface of nickel layer before joining is provided with a metal surface layer which is highly reactive with zinc to form an alloy with zinc, and the metal surface layer does not exist at the joined surface after joining.

Zinc is a substance with low wettability. If a solder material does not wet-spread during heating when joining, uniform joining cannot be attained, and there may arise deficiencies such as joining a joined member at an angle in some cases.

In the present invention of the seventh aspect, therefore, the surface to be joined is provided with a metal surface layer which is highly reactive with zinc to form an alloy with zinc, thereby improving the wettability of the Zn based solder material. The molten Zn based solder material is thought to form an alloy with the reactive metal upon contacting the metal surface layer, and further wet-spreads towards the reactive metal, thereby improving wettability.

On the other hand, if the metal surface layer formed for improving wettability remains after joining with the solder, there are cases where, when the resultant power semiconductor module is used as a product, the metal in the metal surface layer and zinc may form unnecessary reaction products through a thermal cycling. In the present invention described in the seventh aspect, therefore, the metal surface layer after being spread with the solder material is eliminated by being incorporated into the zinc solder by melting.

By so doing, the power semiconductor module which has been uniformly joined at the joining portion with less generation of deficiencies such that joined members are joined at an angle, can be obtained according to the present invention described in the seventh aspect.

The present invention described in an eighth aspect is directed to a power semiconductor module having a power semiconductor element, an insulating substrate and a radiator plate, in which:

at least one of a first joining portion, which is between the power semiconductor element and the insulating substrate, and a second joining portion, which is between the insulating substrate and the radiator plate, is joined with the solder material containing primarily zinc having a coating layer on the surface according to any one of the first to fourth aspects; and the coating layer does not exist at the joined surface after joining with the solder material containing primarily zinc.

The present invention described in the eighth aspect is directed to a power semiconductor module joined with the Zn based solder material of any one of the first to fourth aspects.

The power semiconductor module using the Zn based solder material of the present invention has been densely joined because it is not prevented from joining by an oxide film. Accordingly, the power semiconductor module can prevent heat resistance and electric resistance from increasing at the joining portion thereof.

The present invention described in a ninth aspect is directed to the power semiconductor module according to the eighth aspect, in which the power semiconductor element includes GaN or SiC.

The Zn based solder material used at the joining portion in the present invention has a melting point of from about 330 to about 420° C. Accordingly, the power semiconductor module, even when repeatedly used at a temperature of higher than 200° C. with the next-generation power semiconductor elements GaN or SiC, servers as a highly reliable product without causing deficiencies such as cracking and peeling at the joining portion.

The present invention described in a tenth aspect is directed to the power semiconductor module according to the eighth or ninth aspect, in which the insulating substrate is a $Si_3N_4$ layer, and the $Si_3N_4$ layer is provided with an electroconductive layer containing copper on both sides thereof.

The electroconductive layer arranged on the insulating substrate at the side of the power semiconductor element is preferably one which efficiently conducts electricity from the electroconductive layer to the power semiconductor element. The insulating substrate is arranged between the power semiconductor element and the radiator plate, and therefore it is preferable to transmit heat efficiently.

Accordingly, the insulating substrate preferably not only has insulation properties, but is also excellent in thermal conductivity, and is preferably provided with an electroconductive layer having higher electric conductivity and higher thermal conductivity. These physical properties can be satisfied according to the present invention in the tenth aspect.

The $Cu/Si_3N_4/Cu$ layered body in the tenth aspect is unlikely to cause deficiencies such as cracking, even in a test such as a thermal cycling.

The present invention described in a eleventh aspect is directed to the power semiconductor module according to any one of the eighth to tenth aspects, in which the radiator plate is a layered body including a Cu layer, an Mo layer and a Cu layer (Cu layer/Mo layer/Cu layer) in which a Mo layer is provided with the respective Cu layers on both surfaces thereof.

The Cu/Mo/Cu layered body has high thermal conductivity and effectively functions as a radiator plate. In addition, the Cu/Mo/Cu layered body has a coefficient of thermal expansion of about 4 ppm/K which is near the coefficient of thermal expansion of the power semiconductor element. As a result, the Cu/Mo/Cu layered body does not generate significant thermal stress through thermal cycling and does not cause deficiencies such as cracking and peeling.

The present invention described in a twelfth aspect is directed to the power semiconductor module according to the eleventh aspect, in which the ratio of thicknesses between the Cu layer, the Mo layer and the Cu layer (Cu layer/Mo layer/Cu layer) in the radiator plate is from 1/5/1 to 1/12/1.

When the layered body containing the Cu layer/Mo layer/Cu layer has a ratio of thicknesses of from 1/5/1 to 1/12/1, it is imparted with an excellent balance between thermal conductivity and coefficient of thermal expansion, an may thus function efficiently as a radiator plate.

The present invention described in a thirteenth aspect is directed to the power semiconductor module according to any one of the eighth to twelfth aspects, in which a member to be joined with the solder material containing primarily zinc is selected from the power semiconductor element, the insulating substrate and the radiator plate, and has a nickel layer on the surface to be joined thereof.

According to the present invention described in the thirteenth aspect, the power semiconductor module can prevent the formation of unnecessary reaction products even upon exposure to a thermal cycling, resulting in the prevention of cracking attributable to reaction products and the prevention of deficiencies such as peeling at the interface.

The present invention described in a fourteenth aspect is directed to the power semiconductor module according to the thirteenth aspect, in which the surface of the nickel layer before joining is provided with a metal surface layer which is highly reactive with zinc to form an alloy with zinc, and the metal surface layer does not exist at the joined surface after joining.

In the present invention described in the fourteenth aspect, the Zn based solder material has improved wettability, and is thus unlikely to generate deficiencies such as joining of joined members at an angle, thereby providing a power semiconductor module having uniform joining.

The present invention described in a fifteenth aspect is directed to a method for manufacturing a solder material containing primarily zinc, including providing the surface of a material containing primarily zinc, from which an oxide film has been removed or at which an oxide film does not exist, with a coating layer containing primarily a metal whose oxide is more easily reducible than the oxide film.

The present invention described in a sixteenth aspect is directed to the method for manufacturing a solder material containing primarily zinc according to the fifteenth aspect, in which the oxide film is removed with plasma.

The present invention described in a seventeenth aspect is directed to the method for manufacturing a solder material containing primarily zinc according to the fifteenth aspect, in which the oxide film is removed with a plating pretreatment liquid.

The method of removing a natural oxide film on the surface of the Zn based solder material is preferably a method using plasma or a plating pretreatment liquid. By applying such a method, accurate removal of the oxide film, which cannot be achieved by application of an external physical force such as scrubbing, can be realized.

The present invention described in an eighteenth aspect is directed to the method for manufacturing a solder material containing primarily zinc according to the fifteenth or sixteenth aspect, in which the coating layer is arranged on the surface under a vacuum.

By arranging the coating layer (preferably a layer containing primarily copper) on the surface of the Zn based solder material under a vacuum, it is possible to form the coating layer on the surface of the Zn based solder material from which the oxide film has been removed, without oxide film forming again on the surface of the solder material.

The present invention described in a nineteenth aspect is directed to a method for manufacturing a joined body, including:

preparing a solder material containing primarily zinc, in which a surface of a material containing primarily zinc, from which an oxide film has been removed, or at which an oxide film does not exist, is provided with a coating layer containing primarily a metal whose oxide is more easily reducible than the oxide film, by the manufacturing method according to any one of the fifteenth to eighteenth aspects, holding the solder material containing primarily zinc between a first member and a second member, and heating to join the first member and the second member together and simultaneously eliminate the coating layer.

By heating during joining, the coating layer on the solder material is eliminated by being incorporated by melting into the zinc solder. Thereby, even if an oxide film is formed on the surface of the coating layer, this oxide film is easily reducible and can thus be reduced by heating during joining.

It follows that according to the present invention in the nineteenth aspect, elimination of the coating layer and reduction of the oxide film on the surface of the coating layer can be achieved by heating during joining, without separately arranging a process therefor.

Because the solder material containing primarily zinc is used in the present invention described in the nineteenth aspect, the first member and the second member can be densely joined together.

The present invention described in a twentieth aspect is directed to the method for manufacturing a joined body according to the nineteenth aspect, in which the first and second members are each provided with a nickel layer on their surfaces to be joined.

The present invention described in a twenty-first aspect is directed to the method for manufacturing a joined body according to the twentieth aspect, including:

before the joining, providing a metal surface layer which is highly reactive with zinc to form an alloy with zinc on the surface of the nickel layer, and eliminating the metal surface layer by heating during joining.

According to the present invention described in the twenty-first aspect, the first member and the second member can be densely joined together, the wettability of the solder is improved, and deficiencies such as joining of joined members at an angle are less likely to occur.

In the present invention described in the twenty-first aspect, the metal surface layer arranged on the surface of the nickel layer can be eliminated by heating during joining, without separately arranging a process therefor.

The present invention described in a twenty-second aspect is directed to the method for manufacturing a joined body according to the twenty-first aspect, in which the thickness of the metal surface layer before joining is from 3 nm to 1000 nm.

The present invention described in a twenty-third aspect is directed to the method for manufacturing a joined body according to the twenty-first aspect, in which the thickness of the metal surface layer before joining is from 10 nm to 200 nm.

The metal surface layer does not exist at the interface of joining portion after joining. The conditions under which the metal surface layer is eliminated can be regulated by the heating temperature and heating time at the time of joining. The thickness of the metal surface layer is preferably from 3 to 1000 nm, and more preferably from 10 to 200 nm.

The present invention described in a twenty-fourth aspect is directed to a method for manufacturing a power semiconductor module, including:

preparing a solder material containing primarily zinc, in which a surface of a material containing primarily zinc, from which an oxide film has been removed, or at which an oxide film does not exist, is provided with a coating layer containing primarily a metal whose oxide is more easily reducible than the oxide film, by the manufacturing method according to any one of the fifteenth to eighteenth aspects, holding the solder material containing primarily zinc at at least one of a first joining portion, which is between a power semiconductor element and an insulating substrate, and a second joining portion, which is between the insulating substrate and a radiator plate, and heating to join the at least one joining portion and simultaneously eliminate the coating layer.

According to the present invention described in the twenty-fourth aspect, members for the power semiconductor module can be densely joined together.

Further, according to the present invention described in the twenty-fourth aspect, elimination of the coating layer and reduction of the oxide film on the surface of the coating layer can be achieved by heating during joining, without separately arranging a process therefor.

The present invention described in a twenty-fifth aspect is directed to the method for manufacturing a power semiconductor module according to the twenty-fourth aspect, in which a member to be joined with the solder material containing primarily zinc is selected from the power semiconductor element, the insulating substrate and the radiator plate, and has a nickel layer on the surface to be joined thereof.

The present invention described in a twenty-sixth aspect is directed to the method for manufacturing a power semiconductor module according to the twenty-fifth aspect, including:

before joining, providing a metal surface layer which is highly reactive with zinc to form an alloy with zinc on the surface of the nickel layer, and eliminating the metal surface layer by heating during joining.

According to the present invention described in the twenty-sixth aspect, the members can be densely joined together, the wettability of the solder is improved, and deficiencies, such as joining of joined members at an angle, are unlikely to occur.

Further, according to the present invention described in the twenty-sixth aspect, the metal surface layer arranged on the nickel layer can be eliminated by heating during joining, without separately arranging a process therefor.

The present invention described in a twenty-seventh aspect is directed to the method for manufacturing a power semiconductor module according to the twenty-sixth aspect, in which the thickness of the metal surface layer before joining is from 3 nm to 1000 nm.

The present invention described in a twenty-eighth aspect is directed to the method for manufacturing a power semiconductor module according to the twenty-sixth aspect, in which the thickness of the metal surface layer before joining is from 10 nm to 200 nm.

EFFECTS OF INVENTION

According to the present invention, there can be provided a solder material containing primarily zinc and being capable of dense joining.

According to the present invention, there can also be provided a joined body and a power semiconductor module, which have high heat-resistant and are joined densely.

According to the present invention, there can further be provided methods for manufacturing each of a solder material, a joined body and a power semiconductor module, which are capable of dense joining, respectively.

BEST MODE FOR CARRYING OUT THE INVENTION

<Zn Based Solder Material>

Figure 1:
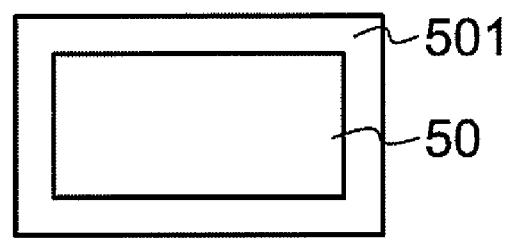
FIG. 1 is a diagram showing a surface treatment method for a material containing primarily zinc (Zn based material), in which (A) shows a Zn based material having a natural oxide film 501 formed the surface thereof, (B) shows the Zn based material from which the oxide film 501 on the surface thereof was removed, and (C) shows the Zn based solder material which is provided, after removal of the oxide film, with a coating layer 51 containing primarily an easily reducible metal on the surface thereof.
Figure 1:
Figure 1:
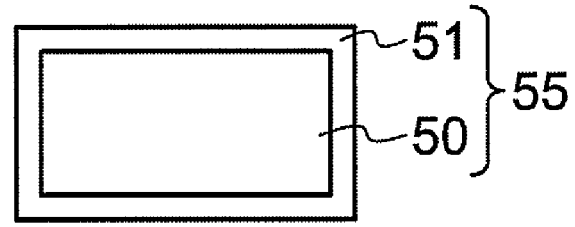

The solder material containing primarily zinc in the present invention is that which a surface of a material containing primarily zinc, from which an oxide film has been removed, or at which an oxide film does not exist, is provided with a coating layer containing primarily a metal whose oxide is more easily reducible than the oxide film.

Hereinafter, the material containing primarily zinc before subjection to surface treatment such as arrangement of a coating layer in the present invention is referred to sometimes as "Zn based material", and the solder material containing primarily zinc after subjection to surface treatment in the present invention is referred to sometimes as "Zn based solder material". The metal whose oxide is more easily reducible than the oxide film is referred to sometimes as "easily reducible metal".

In the present invention, the terms "containing primarily zinc" mean that zinc is contained in an amount of 80% by mass or more.

Specifically, the Zn based material and the Zn based solder material include a pure zinc, a Zn—Al alloy, an alloy represented by $Zn_{(1-x-y)}Al_xM_y$, and a combination of two or more thereof.

Materials including additives such as Ge, Mg, Sn, In and P added to a pure zinc, a Zn—Al alloy, an alloy represented by $Zn_{(1-x-y)}Al_xM_y$, or a combination of two or more thereof can also be used. Such Zn based materials include those described in JP-A Nos. 11-288955, 11-208487, 11-172354, 11-172353, 11-172352, 2000-208533, 2000-61686, 2004-358540 and 2004-358539.

The problem attributable to a natural oxide film of zinc can be solved in the present invention, so that even if a pure zinc, an alloy thereof, or an alloy further containing additives is used, the same effect may be exhibited.

The melting point of pure zinc is about 420° C. Joining at about 420° C. is feasible, but it is a preferable mode that joining is conducted at a temperature of lower than 420° C., in consideration of damage by heating to members to be joined.

Specific examples in which the Zn based material is used include a power semiconductor module. Pure zinc can be used as the solder material used in first joining of a power semiconductor module, but the melting point of the solder material is desirably lower than 450° C. in order to prevent the breakage of a semiconductor element by heating.

In this case, the solder material is preferably a zinc/aluminum alloy in which aluminum is added to zinc so that the melting point (solidus temperature) is lowered. The solder material may, besides zinc and aluminum, contain metal M in an amount of 2% by mass or less. That is, an alloy represented by $Zn_{(1-x-y)}Al_xM_y$ is preferably used.

In the alloy represented by $Zn_{(1-x-y)}Al_xM_y$, the content of Al (the range of x) is preferably from 2% by mass to 10% by mass, and more preferably from 3% by mass to 8% by mass.

When Zn does not contain Al (that is, x is 0), its melting point is about 420° C. as described above, and as the content of Al in Zn increases, the temperature at which melting is finished (liquidus temperature) decreases gradually, and when the content of Al is about 2% by mass, the temperature (liquidus temperature) at which melting is finished is about 410° C., and when the content of Al is about 4 to 6% by mass, the liquidus temperature is about 382° C. When the content of Al is higher than about 6% by mass, the difference between the temperature (solidus temperature) at which melting is initiated and the temperature (liquidus temperature) at which melting is finished is increased such that when the content of Al is 10% by mass, the solidus temperature is about 382° C. and the liquidus temperature is about 410° C. When the content of Al is higher than 10% by mass, the temperature difference between the solidus temperature and the liquidus temperature is greater than 30° C., which may result in a reduction in workability.

In the alloy represented by $Zn_{(1-x-y)}Al_xM_y$, the metal M represents a metal other than zinc and aluminum, and M includes copper and the like. When copper is contained in an amount of 2% by mass or less, the alloy is imparted with an excellent wettability to improve adherence. Even when copper is contained in an amount of 2% by mass, the liquidus temperature hardly changes.

In the alloy represented by $Zn_{(1-x-y)}Al_xM_y$, the content of metal M (the range of y) is from 0 to 2% by mass, and preferably from 0 to 1.5% by mass. When the content of metal M is higher than 2% by mass, the difference between the temperature at which melting is initiated and the temperature at which melting is finished is greater than 30° C., thus deteriorating workability and easily causing deficiencies such as misalignment and inclination of members when joined together.

The method of preparing the alloy represented by $Zn_{(1-x-y)}Al_xM_y$ is not particularly limited, and a known method of preparing alloys may be appropriately used.

When the alloy represented by $Zn_{(1-x-y)}Al_xM_y$ is used in joining, the alloy is used in joining preferably at a temperature higher by several dozen degrees centigrade than the liquidus temperature of the alloy, from the viewpoint of melting the joining portion uniformly to attain sufficient fluidity. For example, a $Zn_{95.8}Al_4M_{0.2}$ alloy having a liquidus temperature of 382° C. is used in joining preferably at about from 410° C. to 440° C.

The Zn based material in the present invention is subjected to surface treatment before use in soldering.

When Zn based material 50 is left in the atmosphere, natural oxide film 501 is formed on the surface thereof, as shown in FIG. 1 (A). In the surface treatment, as shown in FIG. 1 (B), the oxide film 501 on the surface of the Zn based material 50 is removed, and as shown in FIG. 1 (C), the surface is then provided with a coating layer 51 containing primarily an easily reducible metal, to give a surface-treated Zn based solder material 55.

As long as the oxide film on the surface of the Zn based material can be removed, the method of removing the oxide film is not particularly limited. However, the oxide film is removed preferably with plasma or a plating pretreatment liquid, particularly preferably with plasma.

Removal with plasma is performed preferably under a vacuum. A method of applying high-frequency electricity under a vacuum with an argon gas introduced in a trace amount (bias sputtering) is more preferable from the standpoint that after removal of the oxide film, an oxide film is not formed. Specifically, "high-frequency" is a frequency of about 14 MHz. Preferably, the time of plasma discharge is appropriately regulated because this time varies depending on the amount of the oxide film to be removed.

The process of removing the oxide film can be omitted if there is no oxide film on the surface of the Zn based material 50.

The surface of the Zn based material from which the oxide film was removed, or at which an oxide film does not exist, is provided with a coating layer 51 containing primarily an easily reducible metal so that an oxide film is not generated on the surface.

When the oxide film is removed with plasma, the coating layer 51 is formed preferably under a vacuum in order that an oxide film is not generated thereafter. Particularly when the process of removing the oxide film with plasma is carried out under a vacuum, the metal layer is subsequently formed preferably in the same vacuum environment.

The easily reducible metal includes copper (Cu), gold (Au), tin (Sn), silver (Ag), palladium (Pd) and platinum (Pt), and among them, copper (Cu), gold (Au) and silver (Ag) are more preferable.

Preferably, the coating layer contains primarily particularly copper, from the standpoint that (1) a natural oxide film formed on the surface of copper can be easily reduced and (2) copper easily melts in a melt of the zinc based solder so that after joining, the copper layer can be eliminated.

The coating layer containing primarily copper refers to a layer containing at least 50 mass % copper and may be either a layer containing pure copper or a layer containing primarily copper to which additives are added.

The additives added to the coating layer containing primarily copper include Au, Ag, Ni, Sn, Zn, Ni and Mn.

When the oxide film is removed with plasma, the coating layer 51 is formed by sputtering, vapor deposition and the like, and sputtering is a preferable for forming the coating layer because of an easy method.

The conditions under which the coating layer 51 is formed are not particularly limited, and either DC current or AC current may be used. Preferably the power used is also appropriately selected.

Alternatively, the zinc surface layer can be removed with a plating pretreatment liquid to remove the oxide film formed on the surface.

When the oxide film is removed with a plating pretreatment liquid, the coating layer 51 is formed preferably by plating. It is preferable particularly from the viewpoint of preventing formation of an oxide film that without raising the specimen from a plating bath used in removal of the oxide film, the specimen is successively subjected in the same plating bath to plating for forming the metal layer.

The thickness of the coating layer 51 before joining is preferably 5 nm to 500 nm, more preferably 10 nm to 250 nm, and even more preferably 20 nm to 100 nm.

When the coating layer 51 is too thin, the coating layer 51 may be formed in the island shape to allow the Zn based material 50 to be partially exposed, so that an oxide film may formed on the Zn based material 50 when taken out in the air. When the coating layer 51 is too thick, on the other hand, the Zn based material 50 inside of the coating layer 51 may, depending on joining conditions, not appear on the joining surface upon melting or the coating layer 51 may remain on the interface of joining portion even after the joining process.

<Joined Body>

The joined body of the present invention has a first member and a second member, in which the first member and the second member are joined together with the Zn based solder material 55, and the coating layer 51 does not exist at a joined surface after being joined with the Zn based solder material 55.

(The joined body in the first exemplary embodiment and a method for manufacturing the same)

Figure 2:
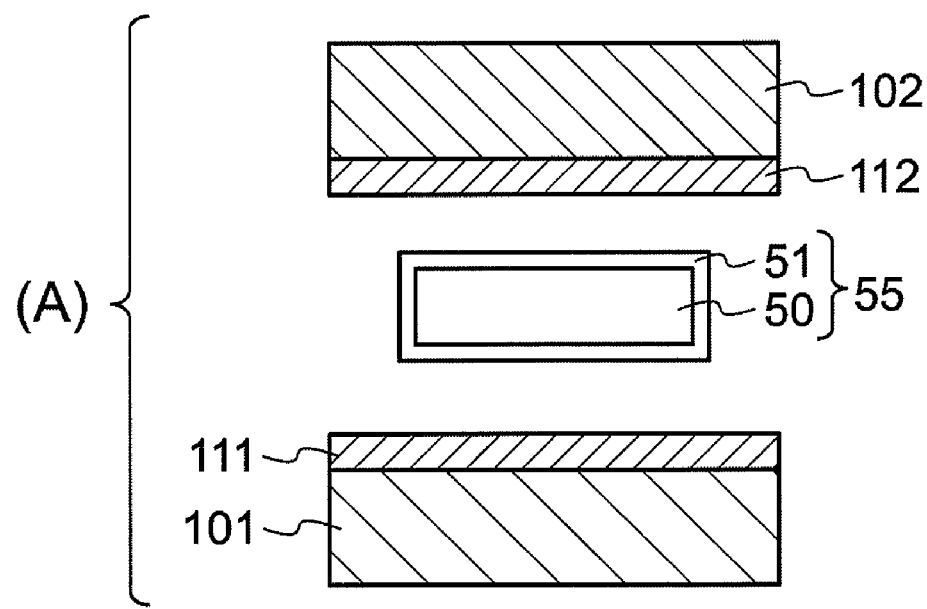
FIG. 2 is a diagram showing one example of the method for manufacturing a joined body in the exemplary embodiment, in which (A) shows the state of members before joining and (B) shows the state of a joined body after joining.
Figure 2:
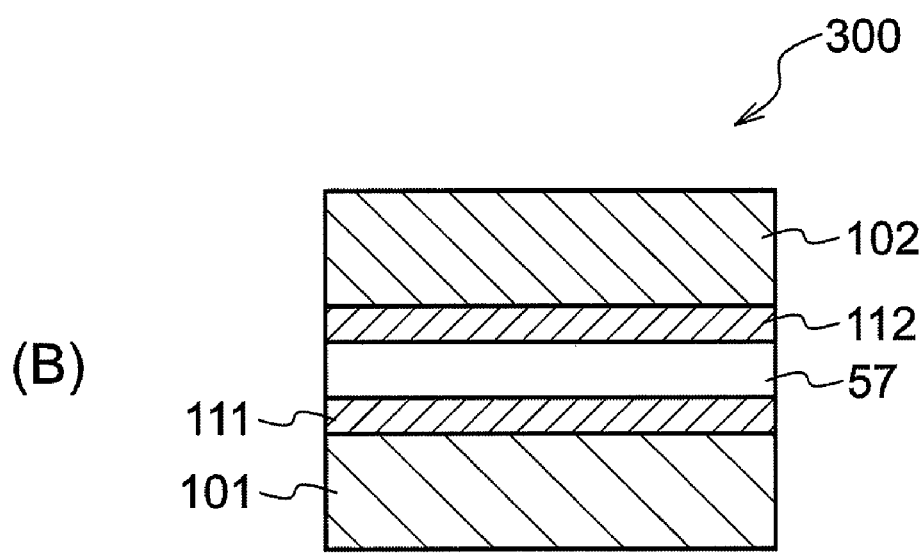

One example of the procedure for manufacturing the joined body in the first exemplary embodiment is shown in FIG. 2. The respective members before joining are shown in FIG. 2 (A), and the resulting joined body 300 is shown in FIG. 2 (B).

Preferably the surfaces to be jointed of the first member 101 and the second member 102 are provided with nickel (Ni) layers 111 and 112, respectively. By arranging the Ni layers 111 and 112, it is possible to prevent unnecessary reaction products from forming at the interface with the Zn based solder material 55, and to increase resistance to temperature change.

Each of the Ni layers 111 and 112 is preferably 0.1 μm to 10 μm in thickness, and more preferably 0.5 μm to 8 μm. Given film thickness in this range, the possibility for the Ni layers to be eliminated by melting in the solder material during joining is lessened, and the influence of the Ni layer on the coefficient of thermal expansion of the joined body as a whole is reduced.

The Ni layers 111 and 112 may be formed by sputtering, plating, vapor deposition or the like.

The surfaces of the Ni layers 111 and 112 may be provided with a thin Au layer (not shown in the figure) respectively for preventing oxidation and securing wettability. This thin Au layer melts in a solder melt during joining and is less likely to remain in the final power semiconductor module.

The thickness of such Au layer is preferably about from 0.01 μm to 0.5 μm, and more preferably from 0.03 μm to 0.1 μm.

First, the Zn based solder material 55 subjected to surface treatment by the method described above is prepared as shown in FIG. 1. The Zn based solder material 55 is provided with the coating layer 51 on the surface of the Zn based material 50 from which the oxide film 501 was removed.

Then, the first member 101 and second member 102 are arranged so as to allow Ni layers 111 and 112 disposed respectively on their surfaces to face each other, and then the surface-treated Zn based solder material 55 is put therebetween. Accordingly, a layered body in a state having the first member 101/Ni layer 111/coating layer 51/Zn based material 50/coating layer 51/Ni layer 112/second member 102 in this order is joined by a reflow method or the like to form a joined body.

The coating layer 51 on the surface of the Zn based solder material 55 contains an easily reducible metal as a main component. When the Zn based solder material 55 is left in the presence of oxygen, an oxide film of the easily reducible metal (preferably copper) is formed on the surface of the coating layer 51, and this oxide film of the easily reducible metal is more easily reducible than an oxide film of zinc. Accordingly, when joining is conducted in a reducing gas atmosphere, the oxide film of the easily reducible metal is reduced at a temperature lower than the temperature (about 400° C.) at which the Zn based material 50 is melted, thereby exposing the easily reducible metal. For example when the easily reducible metal is copper, the oxide film of copper oxide is reduced at about 200° C., to expose copper.

When further heated, the Zn based material 50 initiates melting. The thin coating layer 51 on the surface of the Zn based solder material 50 is broken by volume expansion upon melting, and the molten Zn based material 50 inside of the coating layer wet-spreads on the surface to be joined.

At this time, the coating layer 51 arranged on the surface of the Zn based solder material 55 is very thin and incomparably smaller in volume than the Zn based material 50. Accordingly, the coating layer 51 is incorporated into a solder melt of the molten Zn based material 50 and does not remain on the interface of joining portion as shown in FIG. 2 (B). The joining portion after joining incorporates the coating layer 51, to serve as joining portion 57.

Soldering is conducted preferably at a temperature higher by about 30 to 60° C. than the melting point of the Zn based solder material 55.

Soldering is conducted in an inert gas or reducing gas atmosphere, and preferably in a reducing gas atmosphere in order to reduce the oxide film formed on the surface of the coating layer 51 as described above.

(The joined body in the second exemplary embodiment and a method for manufacturing the same)

Figure 3:
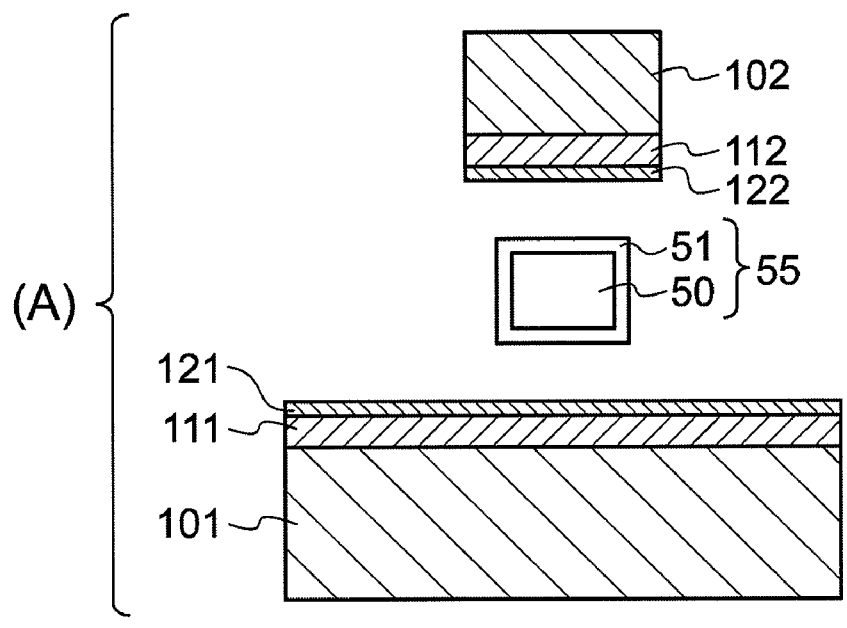
FIG. 3 is a diagram showing the state of wet-spreading of a solder material containing primarily zinc, where the faces to be joined have been provided with a metal surface layer respectively, in which (A) shows the state of members before joining and (B) shows the state of a joined body after joining.
Figure 3:
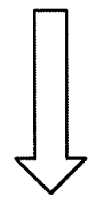
Figure 3:
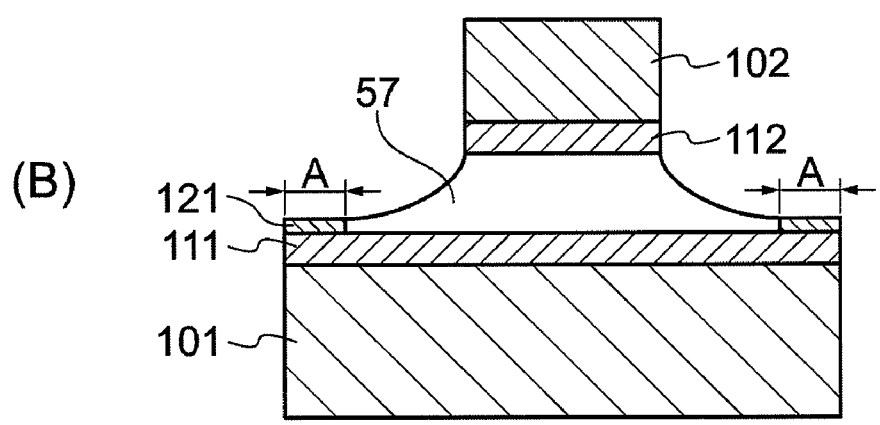

One example of the procedure for manufacturing the joined body in the second exemplary embodiment is shown in FIG. 3. The respective members before joining are shown in FIG. 3(A), and the resulting joined body is shown in FIG. 3 (B). The shapes and dimensions of the first member 101 and the second member 102 are not particularly limited, and FIG. 3 will describe an example as when the surface to be joined of the first member 101 is larger than the surface to be joined of the second member 102.

As shown in FIG. 3 (A), Ni layers 111 and 112 are formed on the surfaces to be joined of the first member 101 and second member 102, respectively. Further, metal surface layers 121 and 122 which are highly reactive with zinc to form an alloy with zinc are formed on the Ni layers 111 and 112, respectively.

The phrase "metal which is highly reactive with zinc" means a metal in which an alloy with zinc is formed in a few seconds and the reaction amount is also large. Specifically, the metal (reactive metal) which is highly reactive with zinc to form an alloy with zinc includes copper (Cu), silver (Ag), gold (Au) or the like.

Particularly, the metal surface layer is preferably a layer containing primarily copper (Cu based layer), from the standpoints: (1) it is highly reactive with zinc and (2) it easily melts in a melt of the Zn based solder so that after joining, the copper layer can be eliminated.

The layer containing primarily copper (Cu based layer) refers to a metal layer containing 50 mass % or more Cu. This layer may be a layer containing pure copper or a copper alloy, or a layer containing primarily copper to which additives may further be added. The copper alloy includes Cu—Au, Cu—Ag, Cu—Ni, Cu—Sn or the like. The additives added to the layer containing primarily copper include zinc (Zn), nickel (Ni), manganese (Mn) or the like.

The Cu based layer is more preferably a metal layer containing 65 mass % or more Cu, and more preferably 80 mass % or more Cu.

Zn is a substance poor in wettability, and so faces to be joined with the Zn based solder material 55 are each provided with a metal (reactive metal) that reacts with molten Zn to easily form an alloy, thereby improving the wettability of the Zn based solder material 55. Specifically, this improvement in wettability uses the phenomenon in which the Zn based solder material 55, when heated during joining and melted at a temperature higher than its melting point, generates a reaction of forming an alloy with the reactive metal and simultaneously spreads towards the reactive metal.

When the metal surface layers 121 and 122 are not arranged on the surfaces to be joined of the first member 101 and the second member 102, as in the joined body in the first exemplary embodiment, the members to be joined may be heated during joining and simultaneously pressed and rubbed against each other with external pressure applied to them, whereby the members can be joined together without being inclined.

However, the members to be joined can be joined together without being inclined in the joined body in the second exemplary embodiment without performing the complicated procedure of applying external pressure to the members under heating such as the joined body in the first exemplary embodiment.

When the metal surface layers 121 and 122 formed for improving wettability remain after joining with the solder, there are cases where when the resultant power semiconductor module is used as a product, Zn and the reactive metal form unnecessary reaction products through thermal cycling.

Such unnecessary reaction products are usually brittle substances or rigid substances, and thus cracking starts from the position in which the unnecessary reaction products are located, resulting in easy generation of deficiencies such as cracking in the joined member and peeling at the interface of joining portion.

Accordingly, the metal surface layers 121 and 122 after wet-spreading of the solder material thereon are desirably eliminated by incorporation of a melt of the Zn solder.

The thickness of the metal surface layers 121 and 122, which allows the metal surface layers 121 and 122 to be eliminated at the interface of joining portion on which the solder material has spread, is determined accordingly because this thickness shall vary depending not only on the heating temperature and heating time during joining with the solder, but also on the type of the solder material, or the like, and therefore it is desired that a preferable thickness of the metal surface layer is appropriately adopted.

However, the thickness of the metal surface layer is generally preferably from 3 nm to 1000 nm, and more preferably from 10 nm to 200 nm. When the metal surface layer is too thin, the layer is formed in the island shape, thus failing to achieve uniform joining in some cases. When the metal surface layer is thicker than 1000 nm, on the other hand, the layer cannot be completely incorporated into a melt of the Zn based solder so that the metal surface layers 121 and 122 may remain.

The metal surface layers 121 and 122 can be formed by sputtering, plating, vapor deposition or the like.

In order to join the first member 101 and the second member 102 together, the first member 101 and the second member 102 are arranged so as to allow the metal surface layers 121 and 122 disposed respectively on their surfaces to face each other, and then the surface-treated Zn based solder material 55 is put therebetween. Accordingly, a layered body in a state having the first member 101/Ni layer 111/metal surface layer 121/coating layer 51/Zn based material 50/coating layer 51/metal surface layer 122/Ni layer 112/second member 102 in this order is joined by a reflow method or the like to form a joining portion 57.

In the joined body in the second exemplary embodiment, the wet-spread state of the Zn based solder material 55 is described with reference to FIG. 3(B).

In this exemplary embodiment, the wettability of zinc is improved by arranging the metal surface layers 121 and 122, so that as shown in FIG. 3 (B), the solder material is uniformly wet-spread by heating for joining. The joining portion 57 formed as a result of wet-spreading may be in such a form called fillet as to spread toward the bottom. Although the joining portion even in such a joining shape is not problematic if it is uniformly joined, the method of preventing the fillet from spreading can be exemplified by the following method.

Figure 4:
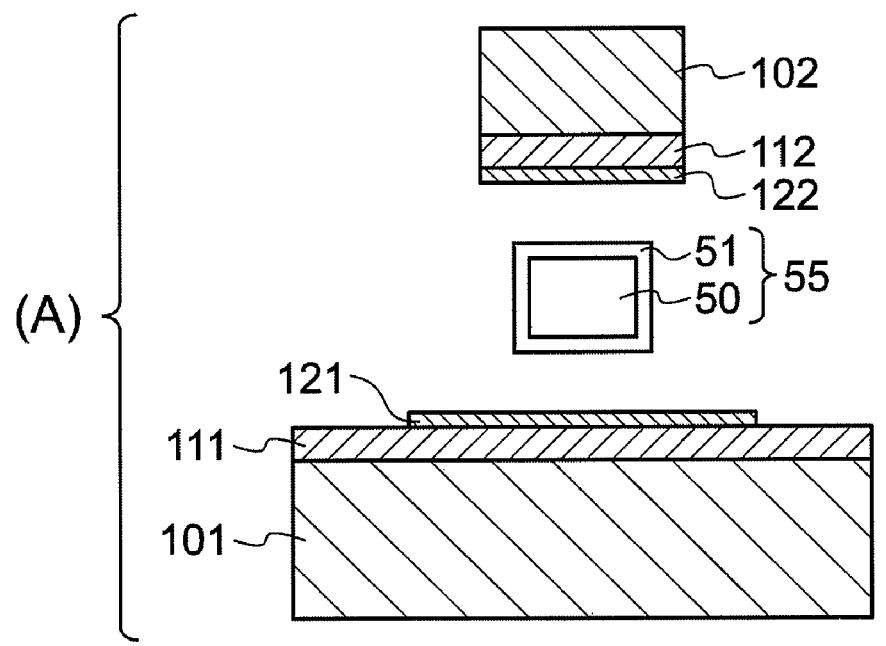
FIG. 4 is a diagram showing one example of the method of regulating the wet-spreading of a solder material containing primarily zinc, when the faces to be joined have been provided with a metal surface layer respectively, in which (A) shows the state of members before joining and (B) shows the state of a joined body after joining.
Figure 4:
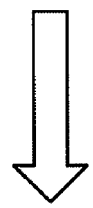
Figure 4:
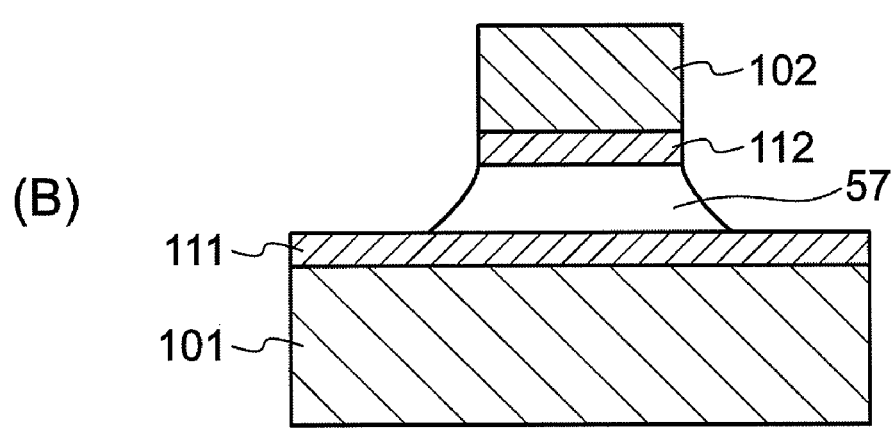

For example, there is a method of allowing the area of the metal surface layer 121 arranged above the first member 101 to be smaller than the area of the first member 101, as shown in FIG. 4 (A) (B).

For forming the metal surface layer 121 having a desired area, the first member 101 plate may be plated through a masking sheet or the like stuck thereon or may be sputtered through a masking member having an opening fixed thereto. Accordingly, this method can regulate the area of the wet-spreading solder material in an easy manner.

The technique of the present invention directly changes the state of the interface, which most influence on wettability, and thus it is a convenient method to regulate the area of wet-spreading of the solder material as shown in FIG. 4 (A) (B).

In conventional methods of improving the wettability of a solder material by adding other substance to the solder material, on the other hand, not only the interface exerting a direct influence on the wettability but also the entire solder material is modified, so that the regulation of the area in which the solder material wet-spreads by the conventional methods is more difficult than in the present invention.

Figure 5:
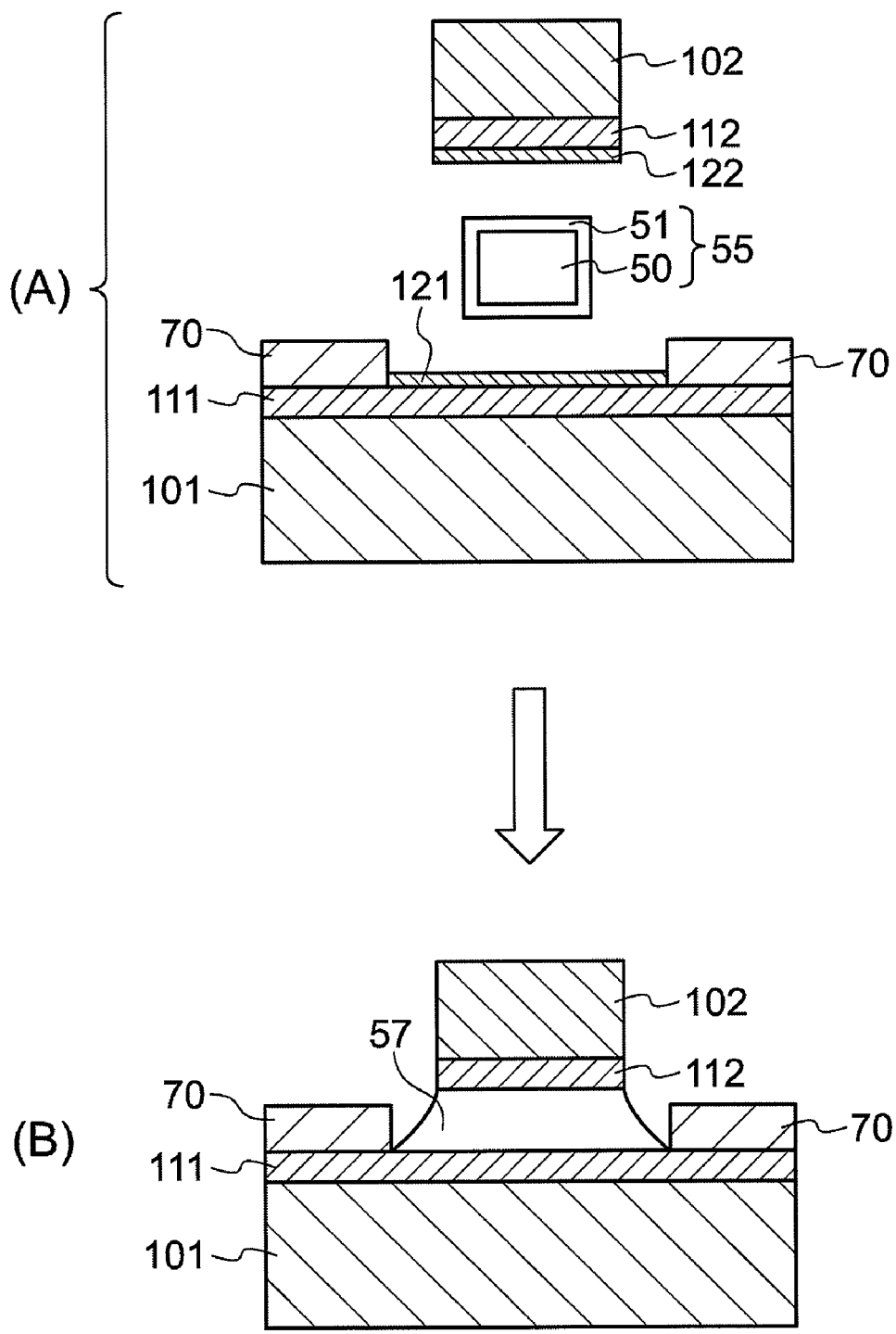
FIG. 5 is a diagram showing another example of the method of regulating the wet-spreading of a solder material containing primarily zinc, where the faces to be joined have been provided with a metal surface layer respectively, in which (A) shows the state of members before joining and (B) shows the state of a joined body after joining.

As shown in FIG. 5 (A) (B), the wet-spreading of the solder material can be regulated by previously patterning a resist 70 or the like on the region where the solder material is prevented from wet-spreading.

After joining, the unnecessary resist may be removed, or if the resist is highly heat-resistant, it may be left as it is.

Preferably, the metal surface layers 121 and 122 does not exist at the joined surface after being joined with the Zn based solder material 55. Whether or not the metal surface layers 121 and 122 were applied may be confirmed from the joined body after joining, on the basis of the region "A" where the metal surface layer 121 remains, as shown in FIG. 3 (B).

The second exemplary embodiment is the same as in the first exemplary embodiment except that the metal surface layers 121 and 122 are arranged respectively on the surfaces to be joined of the first member 101 and the second member 102 in order to improve wettability, and thus description of other features is omitted herein.

<Power Semiconductor Module>

The power semiconductor module of the present invention has a power semiconductor element, an insulating substrate and a radiator plate. At least one joining portion of a first joining portion, which is between the power semiconductor element and the insulating substrate, and a second joining portion, which is between the insulating substrate and the radiator plate, may have been joined with the Zn based solder material 55, or both of the first joining portion and the second joining portion may be joined with the Zn based solder material 55.

(Power semiconductor module in the first exemplary embodiment and a method for manufacturing the same)

Figure 6:
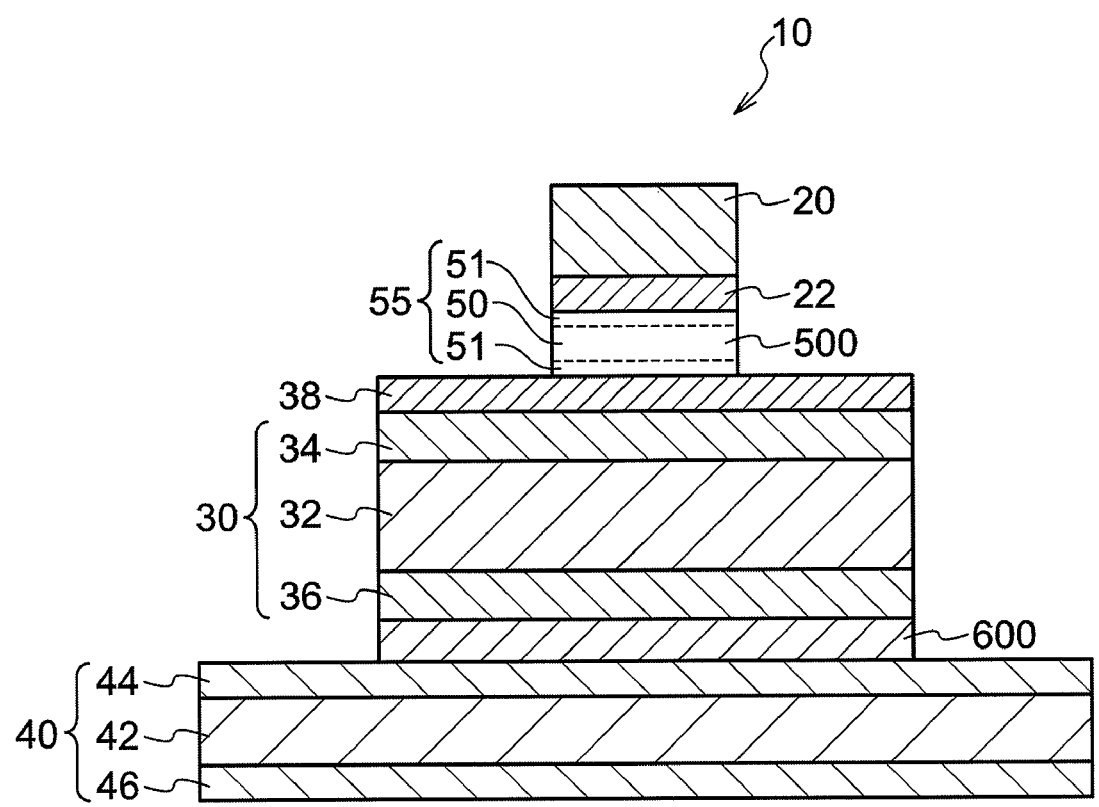
FIG. 6 is a diagram showing the constitution of the power semiconductor module in the first exemplary embodiment.

FIG. 6 schematically shows a sectional view of the main part of the power semiconductor module 10 of the present invention.

The power semiconductor module 10 has a power semiconductor element 20, an insulating portion 30 and a radiator plate 40. The power semiconductor element 20 and the insulting portion 30 are joined together via a first joining portion 500. The insulating portion 30 and the radiator plate 40 are joined together via a second joining portion 600.

The power semiconductor module 10 is used in in-car inverters or the like. Because an internal combustion engine not shown in the figure is arranged on the periphery of the power semiconductor module 10, the environment in which the power semiconductor module 10 is placed is at considerably high temperatures. When next-generation GaN or SiC is used as the power semiconductor element, the power semiconductor element 20 generates significant heat to raise the temperature of the power semiconductor module 10.

To prevent the power semiconductor element from being destroyed by heat generated by itself or in a high-temperature ambient environment, a cooling tube (not shown in the figure) through which cooling water flows is arranged, and the radiator plate 40 is arranged between the cooling tube and the power semiconductor element.

Accordingly, the performance required generally of the power semiconductor module lies firstly in preventing deficiencies such as cracking and peeling through thermal cycling, secondly in securing insulation with the insulating substrate, and thirdly in transmitting heat generated from the power semiconductor element to the radiator plate without accumulating the heat.

To prevent deficiencies such as cracking and peeling through thermal cycling, the members themselves such as the semiconductor element, the insulating substrate, the radiator plate and the joining member should have durability to temperature change, and in addition, it is important that unnecessary reaction products be not generated through thermal cycling. Such reaction products may be brittle substances or too rigid substances, and thus cracking, peeling or the like is likely to occur from the site in which such unnecessary reaction products are located.

It is also important that the respective members have coefficient of thermal expansions close to one another, in order to prevent the generation of cracking and peeling through thermal cycling. If the members completely different in coefficient of thermal expansion are joined together, then cracking, peeling or the like is likely to occur due to the volume change in the members caused repeatedly by thermal cycling.

In the power semiconductor module that is the joined body of the present invention, at least one of the first joining portion 500 and the second joining portion 600 has been joined with the Zn based solder material 55, and thus the heat resistance of the joining portion is sufficiently durable to the operation of the power semiconductor module. In addition, the joining portion is joined with the Zn based solder material 55, in which after a natural oxide film of a surface is removed, the coating layer is provided thereon, and thus the unnecessary oxide film of zinc does not exist at the interface of joining portion, and dense joining is achieved. As a result, the resulting joined body can be prevented from increasing heat resistance and electric resistance at the joining portion.

In the power semiconductor module of the present invention, the Zn based solder material 55 may be applied to any one of the first joining portion 500 and the second joining portion 600, and furthermore, the first joining portion 500 may be first joined and then the second joining portion 600 may be joined, or the second joining portion 600 may be first joined and then the first joining portion 500 may be joined.

In either case, if the temperature upon second soldering is higher than the melting point of the solder material used in first soldering, the portion joined in first soldering is melted during second soldering to cause deficiencies such as dislocation and inclination.

To circumvent this problem, solder materials are selected generally such that the melting point of the solder material used in first soldering is higher than the melting point of the solder material used in second soldering. Preferably, the melting point of the solder material used in second soldering is lower by at least 30° C. than the melting point of the solder material used in first soldering.

That is, when the Zn based solder material 55 having a melting point of about 330° C. to 420° C. is used in first soldering, the solder material used in second soldering is desirably one having a melting point lower by at least 30° C. than the melting point of the Zn based solder material 55. In consideration of heat generation from the power semiconductor, the melting point of the solder material used in second soldering is desirably 200° C. or more. Accordingly, when the Zn based solder material 55 is used in first soldering, the solder material used in second soldering is preferably one having a melting point of about 230° C. to 300° C.

On the other hand, when the Zn based solder material 55 is used in second soldering, the solder material used in first soldering is preferably one having a solidus temperature higher by at least 30° C. than the melting point of the Zn based solder material 55. For preventing the semiconductor element from being broken by heating upon soldering, the melting point is preferably 650° C. or less, and more preferably 450° C. or less. Accordingly, when the Zn based solder material 55 is used in second soldering, the solder material used in first soldering is preferably one having a melting point of 450 to 650° C.

From the foregoing, the Zn based solder material 55 is used preferably in first joining from the viewpoint of its melting point of about 330° C. to 420° C., and the solder material used in second joining is preferably a material having a melting point of about 230° C. to 300° C.

Accordingly, the solder material used in second joining includes a Bi based solder material (melting point: about 270° C.), an Au based solder material (melting point: about 280° C.), a Sn-Sb based solder material (melting point: about 250° C.) or the like. Among them, the Bi based solder material is preferably used as the solder material used in second joining, from the aspect of costs without using any noble metal and from the viewpoint of safety.

Preferably, the Zn based solder material 55 having a higher melting point than Bi is used in the first joining portion 500 near the semiconductor element generating a great deal of heat, and a Bi based solder material or the like is used in the second joining portion 600 far from the semiconductor element.

Accordingly, the first exemplary embodiment shown in FIG. 6 will be described in which the Zn based solder material 55 is used in the first joining portion 500 and another solder material is used in the second joining portion 600.

(First Joining Portion)

The first joining portion 500 in the present invention is arranged for joining the power semiconductor element 20 and the insulating portion 30 together. The solder material containing primarily zinc is used in the first joining portion 500.

In the power semiconductor module in FIG. 6, the interface of the Zn based material 50 and the coating layer 51 are shown in dotted lines because after joining, the coating layer 51 is eliminated by incorporation into the first joining portion 500.

(Joining Surface with the Zn Based Solder Material)

When the Zn based solder material is used as a joining member, the joining surfaces of members to be joined therewith are preferably provided with a Ni layer respectively. That is, in the first exemplary embodiment, the Zn based solder material 55 is used in the first joining portion 500, and thus the surfaces to be joined of the power semiconductor element 20 and the insulating portion 30 are preferably provided with Ni layers 22 and 38, respectively. By arranging the Ni layers 22 and 38, it is possible to prevent unnecessary reaction products from forming at the interface with the Zn based solder material 55 and to increase resistance to temperature change.

Each of the Ni layers 22 and 38 arranged at the surfaces to be joined with the Zn based solder material 55 is preferably from 0.1 µm to 10 µm in thickness, and more preferably from 0.5 µm to 8 µm. When the thickness is less than 0.1 µm, the Ni layer may eliminate by melting in the solder material during joining, while when the thickness is more than 10 µm, the Ni layer may have an influence on the coefficient of thermal expansion of the entire power semiconductor module to cause thermal stress in some cases.

The Ni layers 22 and 38 may be formed by sputtering, plating, vapor deposition or the like.

(Second Joining Portion)

The second joining portion 600 in the present invention is arranged for joining the insulating portion 30 and the radiator plate 40 together. The material of the second joining portion 600 is not particularly limited, but since the Zn based solder material 55 having a melting point of about 330 to 420° C. is used in the first joining portion 500 in the first exemplary embodiment, a material having a melting point of about 230° C. to 300° C. is preferably used in the second joining portion 600, from the point of view of the production process.

As the solder material having the above melting point, it is possible to use a Bi based solder material (melting point: about 270° C.), an Au based solder material (melting point: about 280° C.), a Sn-Sb based solder material (melting point: about 250° C.) or the like.

The Bi based solder material includes pure Bi and Bi to which Cu, Ni or Ag is added, and is preferably any one of Bi based solder materials shown in (1) to (4) below, from the viewpoint that the solidus temperature is not lowered.

Among the Bi based solder materials in (1) to (4) below, the Bi based solder materials in (2) to (4) below are particularly preferable from the viewpoint of resolving the brittleness of Bi to increase mechanical strength.

(1) pure Bi
(2) Bi-CuAlMn having CuAlMn alloy particles dispersed in Bi
(3) Material having Cu added to Bi
(4) Material having Ni added to Bi The Au based solder material includes Au-20Sn (melting point 280° C.), Au-12.5Ge (melting point 361° C.) or the like.

The Sn-Sb based material includes Sn-5Sb (melting point 236° C.), Sn-9Sb (melting point 246° C.) or the like.

The member to be joined with the second joining portion 600 may be provided thereon with a metal film (not shown in the figure) appropriately depending on the solder material used in the second joining portion 600.

(Power Semiconductor Element)

The power semiconductor element 20 is not particularly limited, may be used appropriately depending on the application, and may use general Si substrate or the like.

In the present invention, even when GaN substrate, SiC substrate or the like is used as the next-generation element, since the melting point (solidus temperature) of the Zn based solder material 55 used in the first joining portion 500 is about 330 to 420° C., even at high temperatures made higher than 200° C. by heat generated from the repeatedly used semiconductor element, the resultant power semiconductor module is highly reliable without causing deficiencies such as cracking and peeling.

Because the Zn based solder material 55 is used in the first joining portion 500 in the first exemplary embodiment, the power semiconductor element 20 is provided with a Ni layer 22 on the surface thereof at the side of the first joining portion 500. The rate of growth of products present at the interface between the Zn based solder material 55 and the Ni layer 22 is extremely low through thermal cycling, thus increasing resistance to temperature change.

The Ni layer 22 may be provided thereon with a thin Au layer (not shown in the figure) for preventing oxidation and securing wettability (adherence). This thin Au layer melts in a solder melt during joining and is less likely to remain in the final power semiconductor module.

The thickness of the Au layer is preferably from 0.01 µm to 0.5 µm, and more preferably from 0.03 µm to 0.1 µm. The Au layer may be formed by sputtering, plating, vapor deposition or the like.

(Insulating Portion)

The insulating substrate 32 in the insulating portion 30 is not particularly limited and may be any one capable of securing insulation properties, and preferably has a coefficient of thermal expansion nearly equal to the coefficient of thermal expansion of the semiconductor element such that a marked thermal stress is not generated during thermal cycling.

Specifically, the insulating substrate 32 is formed preferably of AlNAlN, $Si_3N_4$, $Al_2O_3$ or the like, and $Si_3N_4$ or AlNAlN is more preferable from the viewpoint of thermal conductivity and coefficient of thermal expansion. Particularly, $Si_3N_4$ has a breaking strength higher than that of AlNAlN, whereby the lifetime of the insulating member itself is prolonged, and so the insulating substrate 32 is more preferably $Si_3N_4$.

To conduct electrical current from the surface of the insulating substrate 32 at the side of the power semiconductor element to the semiconductor element, the insulating substrate 32 is provided thereon with an electroconductive layer 34. To prevent warpage through temperature change, the insulating substrate 32 is provided at the side of the radiator plate 40 with an electroconductive layer 36 as well.

When an AlN ceramic is used as the insulating substrate 32, the electroconductive layers 34 and 36 are made preferably of Al, Cu, Mo, Ni or the like, and more preferably Al or Cu. Preferably AlN is provided thereon with an Al layer so that it can generate plastic deformation through temperature change to reduce thermal stress, or provided thereon with a Cu layer so that it can reduce thermal stress because the layered body as the insulating portion can be made thin due to the high electric conductivity of the Cu layer.

That is, when an AlN ceramic is used as the insulating substrate 32, the insulating portion 30 is preferably a $Cu/Si_3N_4/Cu$ layered body or an $Al/Si_3N_4/Al$ layered body.

Alternatively, when a $Si_3N_4$ ceramic is used as the insulating substrate 32, the electroconductive layers 34 and 36 are made preferably of Al, Cu, Mo, Ni or the like, more preferably Al and Cu, and still more preferably Cu. Cu is preferable because it has high electric conductivity so that when a Cu layer is arranged, the layered body as the insulating portion can be made thin because of high conductivity, thereby enabling reduction in thermal stress. A $Cu/Si_3N_4/Cu$ layered body is less likely to be broken even through a thermal cycling test and is highly reliable as the insulating portion 30.

Each of the electroconductive layers 34 and 36 arranged on the insulating substrate 32 is preferably from 0.01 mm to 1 mm in thickness, and more preferably from 0.1 mm to 0.8 mm. The thickness outside of this range is not preferable because when the electroconductive layers 34 and 36 are less than 0.01 mm in thickness, loss and heat generation by current in a lateral direction is enormous, while when the thickness is more than 1 mm, the electroconductive layers have an influence on the coefficient of thermal expansion of the entire power semiconductor module, to cause thermal stress.

The method of sticking the electroconductive layers 34 and 36 onto both sides of the insulating substrate 32 is not particularly limited, and known methods such as brazing can be appropriately used.

That surface of the insulating portion 30 at the side of the first joining portion 500 onto which the Zn based solder material 55 is to be applied is preferably provided with a Ni layer 38. As described above, the growth rate of products at the interface of the Zn based solder material 55 with the Ni layer by thermal cycling is very low, so by arranging the Ni layer 38, it is possible to prevent deficiencies such cracking and peeling through temperature change.

The thickness of the Ni layer 38 is preferably from 0.1 μm to 10 μm, and more preferably from 3 μm to 8 μm. The thickness outside of this range is not preferable because when the thickness is less than 0.1 μm, the Ni layer may eliminate by melting in the solder material during joining, while when the thickness is more than 10 μm, the Ni layer exerts an influence on the coefficient of thermal expansion of the entire power semiconductor module to generate thermal stress.

The Ni layer 38 may be provided thereon with a thin Au layer (not shown in the figure) for preventing oxidation and securing wettability. This thin Au layer melts in a solder melt during joining and is less likely to remain in the final power semiconductor module.

The thickness of the Au layer is preferably from 0.01 μm to 0.5 μm, and more preferably from 0.03 μm to 0.1 μm.

The surface of the insulating portion 30 at the side of the second joining portion 600 may be provided appropriately with a metal film (not shown in the figure) depending on the solder material in the second joining portion 600.

(Radiator Plate)

The radiator plate 40 may be used without particular limitation as long as it has radiation performance. However, the radiator plate is preferably that which has sufficiently high thermal conductivity whereby functioning excellently as a radiator plate and has a coefficient of thermal expansion near to that of the semiconductor element.

Preferable examples of the radiator plate 40 include those formed of Mo, a Cu—Mo alloy, Al—SiC, Cu, Al and the like; and Mo is preferable because its thermal conductivity is high and its coefficient of thermal expansion is near to that of the power semiconductor element.

When Mo is used in the radiator plate, Mo is previously provided on both sides thereof with other metal layers. Such metal layers include those of Cu, Ni or the like; and Cu is particularly preferable. Particularly, the radiator plate 40 is preferably a layered body having Cu layers on both sides of Mo, that is, a layered body containing of Cu layer 44/Mo layer 42/Cu layer 46, from the viewpoint of adjustment between thermal conductivity and coefficient of thermal expansion.

When the radiator plate 40 is a layered body containing of a Cu layer 44, a Mo layer 42 and a Cu layer 46 (Cu layer 44/Mo layer 42/Cu layer 46), the ratio of layers thickness is preferably from 1/5/1 to 1/12/1, and more preferably from 1/7/1 to 1/9/1. The ratio of layers thickness outside of this range is not preferable because when the thickness of the Mo layer is less than in the range of 1/5/1, the radiator plate has a coefficient of thermal expansion apart from that of the power semiconductor element, while when the thickness of the Mo layer is more than in the range of 1/12/1, the radiation function of the radiator plate is not sufficiently exhibited.

As to the specific thickness of the layer, the Cu layer 44 or 46 is from 0.05 mm to 1 mm in thickness, and more preferably from 0.2 mm to 0.5 mm. The Mo layer 42 is preferably from 1 mm to 7 mm in thickness, and more preferably 2 mm to 4 mm.

The layered body composed of Cu layer 44/Mo layer 42/Cu layer 46 is preferably from 1 mm to 8 mm in total thickness, and more preferably from 2 mm to 5 mm, in order to exhibit its radiation function efficiently.

The surface of the radiator plate 40 at the side of the second joining portion 600 may be provided appropriately with a metal film (not shown in the figure) depending on the solder material in the second joining portion 600.

Figure 7:
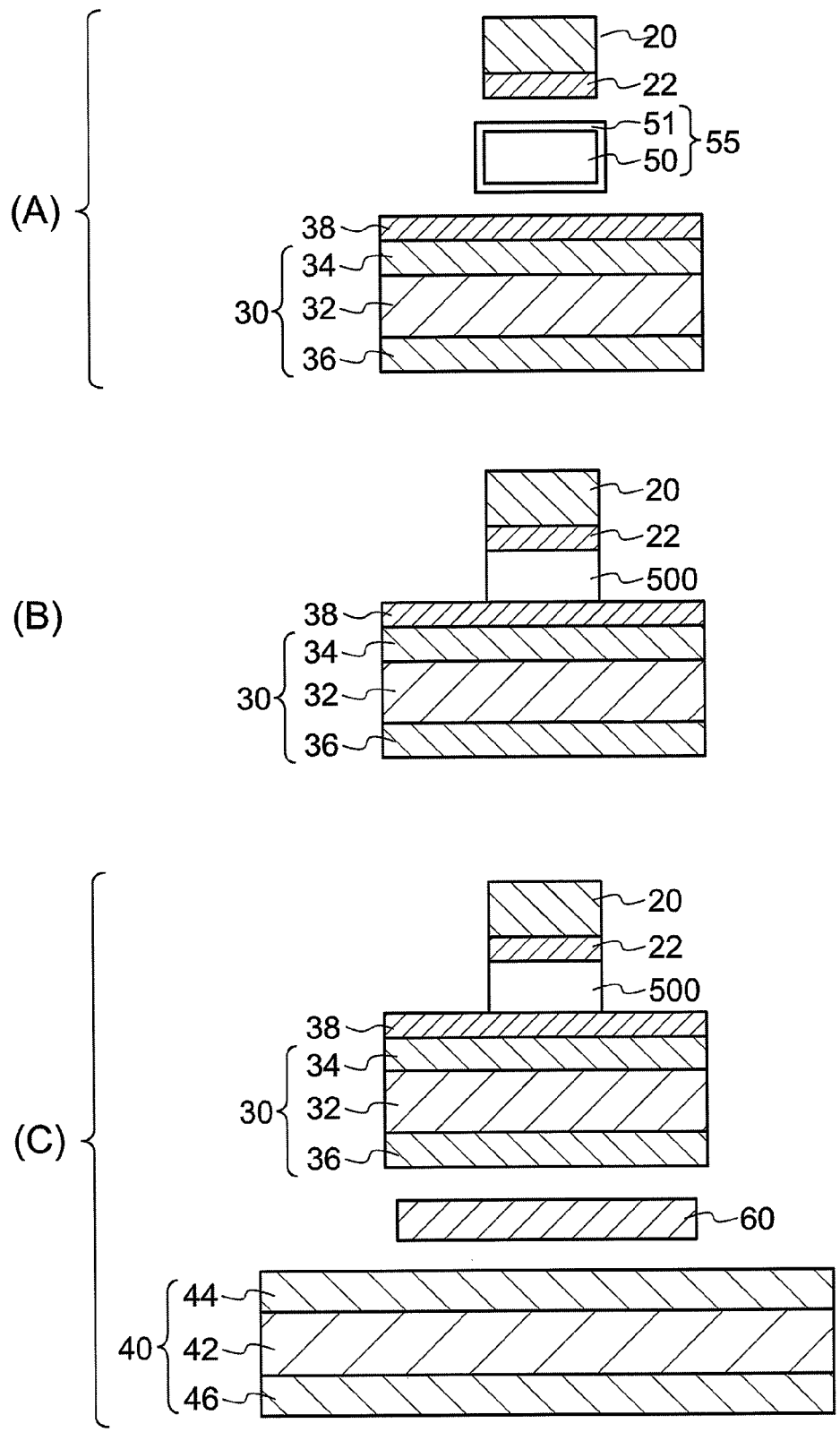
FIG. 7 is a diagram showing one example of a method for manufacturing the power semiconductor module in the first exemplary embodiment, in which (A) is a diagram showing the state of a first joining portion before joining, (B) is a diagram showing the state of the first joining portion after joining, and (C) is a diagram showing the state of a second joining portion before joining.

One example of the procedure for manufacturing the power semiconductor module in the first exemplary embodiment is shown in FIG. 7.

(Preparation of Zn Based Solder Material)

First, the Zn based solder material 55 subjected to surface treatment by the method described above is prepared. The Zn based solder material 55 has been provided, after removal of the oxide film 501, with the coating layer 51 the surface thereof.

(Joining with the First Joining Portion)

Then, as shown in FIG. 7 (A), the power semiconductor element 20 and the insulating portion 30 are arranged so as to face each other, and then the surface-treated Zn based solder material 55 is put therebetween. The Zn based solder material 55 is provided with a coating layer 51 on the surface of a Zn based material 50. Accordingly, a layered body in a state having the power semiconductor element 20/Ni layer 22/coating layer 51/Zn based material 50/coating layer 51/Ni layer 38/insulating layer 30 in this order is joined by a reflow method or the like to form the first joining portion 500.

An oxide film of an easily reducible metal is formed on the surface of the coating layer 51 arranged on the surface of the Zn based solder material 55. However, the oxide film of an easily reducible metal is more easily reducible than the oxide film of zinc, so that when joining is conducted in a reducing gas atmosphere, the oxide film of an easily reducible metal is reduced at a temperature (about 200° C. when the easily reducible metal is copper) lower than the temperature (about 400° C.) at which the Zn based material 50 melts, thereby exposing the easily reducible metal (preferably copper).

When further heated, the Zn based material 50 starts melting. The coating layer arranged on the surface of the Zn based solder material 50 is broken by volume expansion upon melting, and the molten Zn based material 50 inside of the coating layer wet-spreads over the surface to be joined.

At this time, the coating layer 51 arranged on the surface of the Zn based solder material 55 is very thin and incomparably smaller in volume than the Zn based material 50. Accordingly, the coating layer 51 is incorporated into a solder melt of the molten Zn based material 50 and does not remain on the interface of joining portion, as shown in FIG. 7(B).

Soldering is conducted at a temperature higher by about 30 to 60° C. than the melting point of the Zn based solder material 55.

Soldering is conducted in an inert gas or reducing gas atmosphere, and preferably in a reducing gas atmosphere in order to reduce the oxide film formed on the surface of the coating layer, as described above.

The thickness of the formed first joining portion 500 layer is preferably from 5 μm to 500 μm, and more preferably from 10 μm to 200 μm, from the viewpoint of thermal conductivity and thermal stress.

(Joining with the Second Joining Portion)

In joining with the second joining portion 600, as shown in FIG. 7(C), the insulating portion 30 joined via the first joining portion 500 to the power semiconductor element 20, and the radiator plate 40, are arranged so as to allow the insulating portion 30 and the radiator plate 40 to face each other and then a solder material used in the second joining portion 600 is put therebetween, and a layered body in a state having the insulating portion 30/solder material 60/radiator plate 40 in this order is joined by a reflow method or the like to produce the power semiconductor module shown in FIG. 6.

Joining with the second joining portion 600, similar to joining with the first joining portion 500, is also carried out in an inert gas or reducing gas atmosphere. This joining is carried out preferably such that the joining temperature in the second joining portion 600 is higher by about 30 to 60° C. than the melting point of the solder material used in the second joining portion 600, and simultaneously is lower by at least 30° C. than the melting point of the Zn based solder material 55 used in the first joining portion 500.

The melting point of the Zn based solder material 55 used in first joining is higher than that of the solder material used in second soldering, and thus there does not occur deficiency such as a misalignment or inclination that the portion soldered in the first soldering is melted upon the second soldering.

In the first exemplary embodiment, the Zn based solder material 55 having a higher melting point is used in the first joining portion 500 near to the semiconductor element generating a great deal of heat, while the solder material having a melting point lower than that of the Zn based solder material 55 used in the first joining portion 500 is used in the second joining portion 600 far from the semiconductor element, and therefore, the resulting power semiconductor module is imparted with an excellent heat resistance.

The thickness of the second joining portion 600 is preferably from 5 μm to 500 μm, and more preferably from 10 μm to 300 μm, from the viewpoint of thermal conductivity and thermal stress.

(Power Semiconductor Module in the Second Exemplary Embodiment)

In the power semiconductor module in the first exemplary embodiment, the Zn based material 55 is used in the first joining portion 500, and the solder material having a melting point lower than that of the Zn based solder material 55 is used in the second joining portion 600. On the other hand, in the power semiconductor module in the second exemplary embodiment, a solder material having a melting point lower than that of the Zn based solder material 55 is used in the first joining portion 500, and the Zn based material 55 is used in the second joining portion 600.

In the power semiconductor module in the second exemplary embodiment, the second joining portion 600 is first joined, and the first joining portion 500 is then joined. The surface to be joined with the second joining portion 600 using the Zn based solder material 55 is preferably provided with a Ni layer. Other features are the same as in the power semiconductor module in the first exemplary embodiment, and their description is omitted herein.

(Power Semiconductor Module in the Third Exemplary Embodiment)

When the melting point of the Zn based solder material 55 varies significantly by changing the type of an alloy composition and the type and amount of an additive contained therein, the Zn based solder material 55 may be used in both the first and second joining portion s.

In this case, the melting point of the solder material used in second soldering is desirably lower by at least 30° C. than the melting point of the solder material used in first soldering and is desirably 200° C. or more in consideration of generated heat from the power semiconductor.

In consideration of heat generation from the power semiconductor element 20, it is preferable that a solder material having a higher melting point is used in the first joining portion, and a solder material having a lower melting point is used in the second joining portion.

In the power semiconductor module in the third exemplary embodiment, the surfaces to be joined with the first joining portion 500 and the second joining portion 600 are preferably provided with a Ni layer respectively. Other features are the same as in the power semiconductor module in the first exemplary embodiment, and their description is omitted herein.

(Power Semiconductor Module in the Fourth Exemplary Embodiment)

Figure 8:
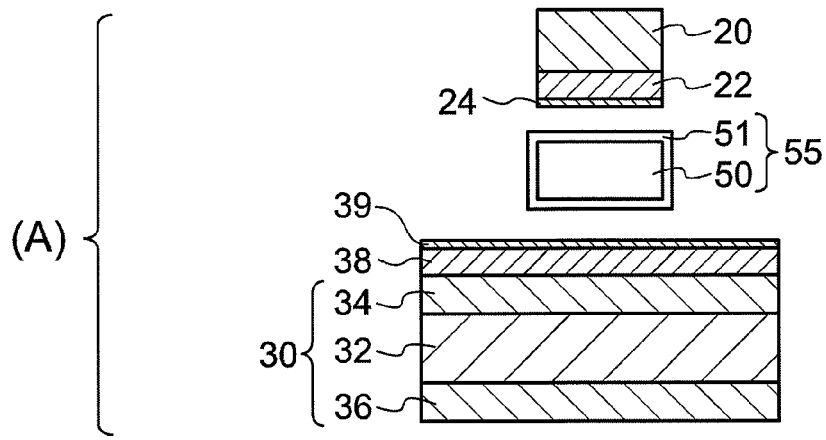
FIG. 8 is a diagram showing one example of a method for manufacturing the power semiconductor module in the second exemplary embodiment, in which (A) is a diagram showing the state of a first joining portion before joining, (B) is a diagram showing the state of the first joining portion after joining, and (C) is a diagram showing the state of a second joining portion before joining.
Figure 8:
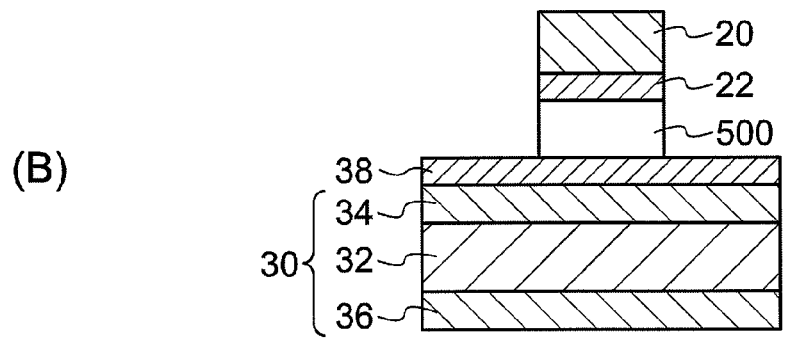
Figure 8:
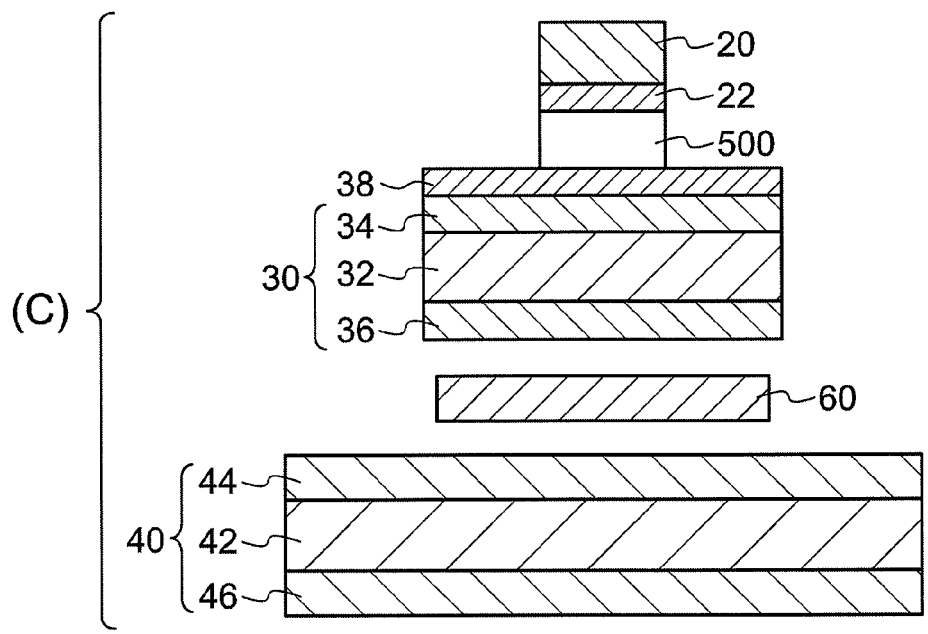

As with the joined body in the second exemplary embodiment, a metal surface layer is arranged on the surface to be joined in order to improve the wettability of the Zn based solder material 55. FIG. 8 will be described as when the Zn based solder material 55 is used in the first joining portion.

As shown in FIG. 8 (A) (B), Ni layers 22 and 38 are provided thereon with metal surface layers 24 and 39 respectively. The metal surface layers 24 and 39 after being wet-spread with the solder material are desirably eliminated by incorporation into a melt of the zinc solder.

The metal surface layers 24 and 39 have the same meaning as that of the metal surface layers 121 and 122 described above in the joined body in the second exemplary embodiment.

The power semiconductor module in the fourth exemplary embodiment is the same as in the first exemplary embodiment except that the metal surface layers 24 and 39 are arranged on the surfaces of the power semiconductor element 20 and the insulating portion 30 respectively to be joined with the Zn based solder material 55, in order to improve the wettability of the solder material, and thus description of other features is omitted.

In the fourth exemplary embodiment, the Zn based solder material 55 is used in the first joining portion 500, and thus the metal surface layers 24 and 39 are arranged on the surfaces of the power semiconductor element 20 and the insulating portion 30, but when the Zn based solder material 55 is used in the second joining portion 600, the metal surface layers 24 and 39 are arranged on the surfaces to be joined of the insulating portion 30 and the radiator plate 40.

<Effect>

The power semiconductor module obtained by the manufacturing method of the present invention does not have an oxide film between the Zn based solder material 55 and the surface to be joined, thus attaining a densely joined interface. As a result, the power semiconductor module can be prevented from increasing heat resistance at the joining portion and can efficiently transmit heat generated from the power semiconductor element to a cooling medium such as cooling water.

Even if the joining portion is subject to thermal stress attributable to a difference in coefficients of thermal expansion of the joined members, the joining portion does not have defects such as voids, thus is less likely to undergo cracking, and therefore, the resultant power semiconductor module is highly reliable through thermal cycling.

EXAMPLES

Hereinafter, the present invention is described with reference to the Examples, but these examples are merely illustrative of one example of the method for manufacturing the power semiconductor module of the present invention and not intended to limit the present invention.

Example 1

According to FIG. 7 (A) (B), a power semiconductor element and an insulating substrate were joined together with a Zn based solder material 55 to prepare an evaluation test specimen-1 having the structure shown in FIG. 7 (B).

<Preparation of a Power Semiconductor Element>

A power semiconductor element 20 using GaN was prepared, and on the outermost surface of the element, a Ni layer 22 was formed by sputtering. On the surface of the Ni layer 22, an Au layer (not shown in the figure) was formed by sputtering.

<Preparation of an Insulating Portion>

Separately, Cu layers 34 and 36 were stuck by brazing onto both sides of a $Si_3N_4$ ceramic plate as an insulating substrate 32 to prepare a layered body of Cu layer 34/$Si_3N_4$ layer 32/Cu layer 36. A Ni layer 38 was formed by plating on the surface of the Cu layer in this layered body to prepare an insulating portion 30. In this plating, a surface not to be plated was protected with a masking sheet or the like.

<Preparation of a First Joining Portion>

A solder material including 4% by mass of Al added to zinc ($Zn_{0.96}Al_{0.04}$ alloy: melting point 380° C.) was prepared and processed by rolling into a foil of 0.1 mm in thickness. Then, the solder foil was placed in a sputtering apparatus where the surface of the solder foil was etched by bias sputtering. This etching was conducted with plasma generated with a high frequency of 13.56 MHz at a voltage of 100 W under a vacuum to which an argon gas was injected. The etching time was 15 minutes.

Then, the specimen was moved under high vacuum kept in the vacuum apparatus, and a copper film was formed by sputtering on the surface of the specimen. This sputtering was conducted with direct current at a voltage of 40 W, during which based on a previously measured film-making rate, the sputtering time was regulated such that the film thickness reached 50 nm.

The solder foil having a copper film formed thereon was taken out from the vacuum apparatus, and the solder foil was reversed, then etched by bias sputtering and provided with a copper film in the same manner as above, and taken out from the vacuum apparatus.

<Joining with the First Joining Portion>

The Ni layer 22 of the power semiconductor element 20 prepared above, and the Ni layer 38 of the insulating portion 30 were arranged so as to face each other, and then the $Zn_{0.96}Al_{0.04}$ layer 50 was put therebetween. The layered body was set to a carbon jig for positioning, and placed in an electric furnace.

A nitrogen gas containing 5 vol % hydrogen gas flowed constantly in a reactor core of the electric furnace so that a reducing atmosphere was kept therein. In this state, the specimen was heated from room temperature to 430° C. over 30 minutes, then kept at 430° C. for 5 minutes, cooled to ordinary temperatures or thereabout, and taken out to give an evaluation test specimen-1.

<Observation of the Joined Surface>

The whole joined surface of the evaluation test specimen-1 was first observed nondestructively by ultrasonic flaw detection, then the evaluation test specimen-1 was cut, and its cut plane was polished and then observed with an electron microscope.

As a result, the joined surface of the evaluation test specimen-1 was confirmed to have slight voids, but it was a dense joining overall.

In the evaluation test specimen-1, it was not observed that copper remained in the vicinity of the interface of joining portion, and therefore, it was considered that copper was incorporated into a solder melt upon melting of the solder.

Comparative Example 1

A comparative evaluation test specimen-2 was prepared with the same construction as that of the evaluation test specimen-1 in Example 1 except that a $Zn_{0.96}Al_{0.04}$ alloy not subjected to bias sputtering and not provided with a copper film, and the untreated $Zn_{0.96}Al_{0.04}$ alloy was used in the first joining portion.

In this process, the $Zn_{0.96}Al_{0.04}$ layer was put between the power semiconductor element 20 and the insulating portion 30, and the power semiconductor element 20 and the insulating portion 30 were pressurized from outside upon joining with the first joining portion such that a natural oxide film formed on the $Zn_{0.96}Al_{0.04}$ alloy was broken to discharge the $Zn_{0.96}Al_{0.04}$ alloy inside of the oxide film onto the surface to be joined.

The joined surface of the comparative evaluation test specimen-2 thus obtained was observed in the same manner as in Example 1. As a result, the comparative evaluation test specimen-2 was observed to have many portions not joined. The reason for this is considered that although the natural oxide film formed on the solder foil was broken to discharge the solder material, the oxide film remained at the joining portion and the portions in which the oxide film remained were not joined.

Example 2

In Example 2, removal of the natural oxide film and subsequent formation of the copper film were conducted by plating, replacing of bias sputtering and sputtering in Example 1.

A solder material including 4% by mass of Al added to zinc ($Zn_{0.96}Al_{0.04}$ alloy: melting point 380° C.) was prepared and processed by rolling into a foil of 0.1 mm in thickness. Then, the solder foil was placed in a pretreatment liquid for removing an oxide film, and then dipped in a copper plating liquid. Based on the previously determined relationship between plating thickness and plating time, the plating conditions were regulated such that the plating thickness reached 50 nm.

After plating, the specimen was used to prepare a joined body in the same manner as in Example 1 to give an evaluation test specimen-3.

The joined surface of the evaluation test specimen-3 thus obtained was observed in the same manner as in Example 1. As a result, at the joined surface of the evaluation test specimen-3, the joined portions having regions with slight voids are observed, but the joined surface was a dense joining overall.

Example 3

According to FIG. 8(A) (B), a power semiconductor element and an insulating substrate were joined together with a Zn based solder material 55 to prepare an evaluation test specimen-4 having the structure shown in FIG. 8 (B).

<Preparation of a Power Semiconductor Element>

A GaN power semiconductor element 20 having 1 $cm^2$ of a surface to be joined was prepared, and on the outermost surface of the element, a Ni layer 22 was formed by sputtering. On the surface of the Ni layer 22, a Cu layer 24 was formed by sputtering. The thickness of the Ni layer 22 was 0.7 μm, and the thickness of the Cu layer 24 was 50 nm by measurement under an electron microscope.

<Preparation of an Insulating Portion>

Meanwhile, Cu layers 34 and 36 were stuck by brazing onto both sides of a $Si_3N_4$ ceramic plate as an insulating substrate 32 to prepare a layered body of Cu layer 34/$Si_3N_4$ layer 32/Cu layer 36.

A Ni layer 38 was formed by plating on the surface of the Cu layer in the layered body, and a Cu layer 39 was formed by sputtering on the Ni layer 38, to prepare an insulating portion 30. In this plating, a face not to be plated was protected with a masking sheet or the like. The thickness of the Cu layer 39 was 50 nm.

An evaluation test specimen-4 was obtained in the same manner as in Example 1 except that the power semiconductor element and the insulating portion prepared as described above were used.

The joined surface of the resulting evaluation test specimen-4 was observed in the same manner as in Example 1. As a result, the joined surface of the evaluation test specimen-4 was found to be more densely joined than the joined surface of the evaluation test specimen-1 in Example 1.

In the evaluation test specimen-4, it was not observed that copper remained in the vicinity of the interface of joining portion, and therefore, it was considered that copper was incorporated into a solder melt upon melting of the solder.

The disclosure of Japanese Patent Application No. 2007-300792 is incorporated herein by reference in its entirety.

All literatures, patent applications and technical standards described in this specification are incorporated by reference herein to the same degree as in the case where the individual literatures, patent applications and technical standards are specifically and individually described.

The invention claimed is:

1. A solder material comprising primarily zinc, wherein a surface of a material comprising primarily zinc, from which a natural oxide film has been removed, or at which a natural oxide film has not yet formed, is provided with a coating layer comprising primarily a metal whose oxide is more easily reducible than the natural oxide film when formed, and
   wherein the material comprising primarily zinc is an alloy represented by $Zn_{(1-x-y)}Al_xM_y$, wherein x is from 0.02 to 0.10, y is from 0 to 0.02, and M represents a metal other than zinc and aluminum.

2. The solder material comprising primarily zinc according to claim 1, wherein the coating layer is a layer comprising primarily copper.

3. The solder material comprising primarily zinc according to claim 1, wherein the thickness of the coating layer is from 5 nm to 500 nm.

4. A joined body comprising a first member and a second member, wherein:
   the first member and the second member are joined together with the solder material comprising primarily zinc having a coating layer on the surface according to claim 1, and
   the coating layer does not exist at a joined surface after joining with the solder material comprising primarily zinc.

5. The joined body according to claim 4, wherein the surfaces to be joined of the first member and the second member are each provided with a nickel layer.

6. The joined body according to claim 5, wherein the a surface of nickel layer before joining is provided with a metal surface layer which is highly reactive with zinc to form an alloy with zinc, and the metal surface layer does not exist at the joined surface after joining.

7. A power semiconductor module comprising a power semiconductor element, an insulating substrate and a radiator plate, wherein:
   at least one of a first joining portion, which is between the power semiconductor element and the insulating substrate, and a second joining portion, which is between the insulating substrate and the radiator plate, is joined with the solder material comprising primarily zinc having a coating layer on the surface according to claim 1; and
   the coating layer does not exist at the joined surface after joining with the solder material comprising primarily zinc.

8. The power semiconductor module according to claim 7, wherein the power semiconductor element comprises GaN or SiC.

9. The power semiconductor module according to claim 7, wherein the insulating substrate is a $Si_3N_4$ layer, and the $Si_3N_4$ layer is provided with an electroconductive layer comprising copper on both sides thereof.

10. The power semiconductor module according to claim 7, wherein the radiator plate is a layered body comprising a Cu layer, an Mo layer and a Cu layer (Cu layer/Mo layer/Cu layer) in which a Mo layer is provided with the respective Cu layers on both surfaces thereof.

11. The power semiconductor module according to claim 10, wherein the ratio of thicknesses between the Cu layer, the Mo layer and the Cu layer (Cu layer/Mo layer/Cu layer) in the radiator plate is from 1/5/1 to 1/12/1.

12. The power semiconductor module according to claim 7, wherein a member to be joined with the solder material comprising primarily zinc is selected from the power semiconductor element, the insulating substrate and the radiator plate, and has a nickel layer on the surface to be joined thereof.

13. The power semiconductor module according to claim 12, wherein the surface of the nickel layer before joining is provided with a metal surface layer which is highly reactive with zinc to form an alloy with zinc, and the metal surface layer does not exist at the joined surface after joining.

14. A method for manufacturing a solder material comprising primarily zinc, comprising providing the surface of a material comprising primarily zinc, from which a natural oxide film has been removed or at which a natural oxide film has not yet formed, with a coating layer comprising primarily a metal whose oxide is more easily reducible than the natural oxide film when formed, and
wherein the material comprising primarily zinc is a pure zinc or an alloy represented by $Zn_{(1-x-y)}Al_xM_y$, wherein x is from 0.02 to 0.10, y is from 0 to 0.02, and M represents a metal other than zinc and aluminum.

15. The method for manufacturing a solder material comprising primarily zinc according to claim 14, wherein the natural oxide film is removed with plasma.

16. The method for manufacturing a solder material comprising primarily zinc according to claim 14, wherein the natural oxide film is removed with a plating pretreatment liquid.

17. The method for manufacturing a solder material comprising primarily zinc according to claim 14, wherein the coating layer is arranged on the surface under a vacuum.

18. A method for manufacturing a joined body, comprising:
preparing a solder material comprising primarily zinc, wherein a surface of a material comprising primarily zinc, from which a natural oxide film has been removed, or at which a natural oxide film has not yet formed, is provided with a coating layer comprising primarily a metal whose oxide is more easily reducible than the natural oxide film when formed, by the manufacturing method according to claim 14,
holding the solder material comprising primarily zinc between a first member and a second member, and
heating to join the first member and the second member together and simultaneously eliminate the coating layer.

19. The method for manufacturing a joined body according to claim 18, wherein the first and second members are each provided with a nickel layer on their surfaces to be joined.

20. The method for manufacturing a joined body according to claim 19, comprising:
before the joining, providing a metal surface layer which is highly reactive with zinc to form an alloy with zinc on the surface of the nickel layer, and
eliminating the metal surface layer by heating during joining.

21. The method for manufacturing a joined body according to claim 20, wherein the thickness of the metal surface layer before joining is from 3 nm to 1000 nm.

22. The method for manufacturing a joined body according to claim 20, wherein the thickness of the metal surface layer before joining is from 10 nm to 200 nm.

23. A method for manufacturing a power semiconductor module, comprising:
preparing a solder material comprising primarily zinc, wherein a surface of a material comprising primarily zinc, from which a natural oxide film has been removed, or at which a natural oxide film has not yet formed, is provided with a coating layer comprising primarily a metal whose oxide is more easily reducible than the natural oxide film when formed, by the manufacturing method according to claim 14,
holding the solder material comprising primarily zinc at at least one of a first joining portion, which is between a power semiconductor element and an insulating substrate, and a second joining portion, which is between the insulating substrate and a radiator plate, and
heating to join the at least one joining portion and simultaneously eliminate the coating layer.

24. The method for manufacturing a power semiconductor module according to claim 23, wherein a member to be joined with the solder material comprising primarily zinc is selected from the power semiconductor element, the insulating substrate and the radiator plate, and has a nickel layer on the surface to be joined thereof.

25. The method for manufacturing a power semiconductor module according to claim 24, comprising:
before joining, providing a metal surface layer which is highly reactive with zinc to form an alloy with zinc on the surface of the nickel layer, and
eliminating the metal surface layer by heating during joining.

26. The method for manufacturing a power semiconductor module according to claim 25, wherein the thickness of the metal surface layer before joining is from 3 nm to 1000 nm.

27. The method for manufacturing a power semiconductor module according to claim 25, wherein the thickness of the metal surface layer before joining is from 10 nm to 200 nm.

* * * * *